(12) United States Patent
Nam et al.

(10) Patent No.: US 8,976,591 B2
(45) Date of Patent: Mar. 10, 2015

(54) NONVOLATILE MEMORY DEVICE AND MEMORY SYSTEM INCLUDING THE SAME

(75) Inventors: Sang-Wan Nam, Hwaseong-si (KR); Kyung-Hwa Kang, Seoul (KR); Junghoon Park, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 140 days.

(21) Appl. No.: 13/619,118

(22) Filed: Sep. 14, 2012

(65) Prior Publication Data

US 2013/0170297 A1 Jul. 4, 2013

(30) Foreign Application Priority Data

Jan. 4, 2012 (KR) .................. 10-2012-0000999

(51) Int. Cl.
*G11C 16/04* (2006.01)
*H01L 27/115* (2006.01)

(52) U.S. Cl.
CPC .............. *G11C 16/04* (2013.01); *H01L 27/115* (2013.01); *G11C 16/0483* (2013.01)
USPC .................. 365/185.17; 365/185.05

(58) Field of Classification Search
CPC ........................... G11C 16/04; G11C 16/0483
USPC .......................... 365/185.05, 185.09, 185.17
See application file for complete search history.

(56) References Cited

U.S. PATENT DOCUMENTS

| 7,626,228 | B2 | 12/2009 | Park et al. | |
| 7,646,664 | B2 * | 1/2010 | Cho et al. ................. | 365/230.06 |
| 8,133,784 | B2 | 3/2012 | Chung et al. | |
| 2007/0165455 | A1 | 7/2007 | Park et al. | |
| 2010/0195395 | A1 | 8/2010 | Jeong et al. | |
| 2010/0248439 | A1 | 9/2010 | Chung et al. | |
| 2011/0002178 | A1 | 1/2011 | Hwang et al. | |
| 2011/0019486 | A1 * | 1/2011 | Jang et al. ................. | 365/185.25 |
| 2011/0194357 | A1 * | 8/2011 | Han et al. ................. | 365/185.29 |
| 2011/0216603 | A1 * | 9/2011 | Han et al. ................. | 365/185.23 |
| 2012/0033501 | A1 | 2/2012 | Park et al. | |

FOREIGN PATENT DOCUMENTS

| KR | 100673019 B1 | 1/2007 |
| KR | 1020100089022 A | 8/2010 |
| KR | 1020100107661 A | 10/2010 |
| KR | 1020110003764 A | 1/2011 |
| KR | 10-2012-0023194 | 3/2012 |

* cited by examiner

*Primary Examiner* — Hoai V Ho
*Assistant Examiner* — Tri Hoang
(74) *Attorney, Agent, or Firm* — Harness, Dickey & Pierce, PLC

(57) ABSTRACT

According to example embodiments, a nonvolatile memory device includes a first and a second NAND string. The first NAND string includes a first string selection transistor, a first local ground and a first global ground selection transistor, and first memory cells stacked in a direction perpendicular to a substrate. The second NAND string includes a second string selection transistor, a second local ground and a second global ground selection transistor, and second memory cells stacked in the direction perpendicular to the substrate. The device includes a selection line driver including path transistors configured to select and provide at least one operation voltage to the first and second string selection transistors, the first and second local and global ground selection transistors. The first and second string selection transistors are electrically isolated from each other, and the first and second global ground selection transistors are electrically connected.

31 Claims, 17 Drawing Sheets

ND string, a second NAND string, and a selection line driver. The first

NONVOLATILE MEMORY DEVICE AND MEMORY SYSTEM INCLUDING THE SAME

CROSS-REFERENCE TO RELATED APPLICATIONS

This application claims priority under 35 U.S.C. §119 to Korean Patent Application No. 10-2012-0000999 filed Jan. 4, 2012, in the Korean Intellectual Property Office, the entire contents of which are hereby incorporated by reference.

BACKGROUND

Example embodiments of inventive concepts relate to a semiconductor memory device, and more particularly, relate to a nonvolatile memory device and/or a memory system including the nonvolatile memory device.

A semiconductor memory device may be fabricated using semiconductors such as silicon (Si), germanium (Ge), gallium arsenide (GaAs), indium phosphide (InP), and the like. Semiconductor memory devices may be classified into volatile memory devices and nonvolatile memory devices.

The volatile memory devices may lose stored contents at power-off. The volatile memory devices may include a static RAM (SRAM), a dynamic RAM (DRAM), a synchronous DRAM (SDRAM), and the like. The nonvolatile memory devices may retain stored contents even at power-off. The nonvolatile memory devices may include a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), and the like. The flash memory device may be roughly divided into a NOR type and a NAND type.

A NAND flash memory device may have a two-dimensional or three-dimensional memory cell array. A three-dimensional NAND flash memory device may have a shared word line structure within a memory block.

SUMMARY

According to example embodiments of inventive concepts, a nonvolatile memory device includes a first NAND string and a second NAND string. The first NAND string includes a first string selection transistor, a first local ground selection transistor, a first global ground selection transistor, and a plurality of first memory cells stacked in a direction perpendicular to a substrate. The second NAND string includes a second string selection transistor, a second local ground selection transistor, a second global ground selection transistor, and a plurality of second memory cells stacked in the direction perpendicular to the substrate. The nonvolatile memory device includes a selection line driver including path transistors configured to select and provide at least one operation voltage to the first and second string selection transistors, the first and second local ground selection transistors, and the first and second global ground selection transistors. The first and second global ground selection transistors are electrically connected, and the first and second string selection transistors are electrically isolated from each other.

According to example embodiments of inventive concepts, a nonvolatile memory device includes a first NAND string, a second NAND string, and a selection line driver. The first NAND string includes a first string selection transistor, a first local ground selection transistor, a first global ground selection transistor, and a plurality of first memory cells stacked in a direction perpendicular to a substrate. The second NAND string includes a second string selection transistor, a second local ground selection transistor, a second global ground selection transistor, and a plurality of second memory cells stacked in the direction perpendicular to the substrate. The nonvolatile memory device includes a global ground selection line connecting the first and second global ground selection transistors, a first selection line connecting the first string selection transistor and the first local ground selection transistor, and a second line connecting the second string selection transistor and the second local ground selection transistor. The first and second selection lines are electrically isolated from each other.

The nonvolatile memory device may further include a selection line driver configured to select and provide at least one operation voltage to the first and second selection lines. The selection line driver may include first and second path transistors, the first line being connected to the first path transistor, and the second line being connected to the second path transistor.

According to example embodiments of inventive concepts, a nonvolatile memory device includes a plurality of memory cell strings, each of the plurality of memory cell strings including a string selection transistor, a local ground selection transistor, and a plurality of memory cells stacked in a direction perpendicular to a substrate; and first to third local ground selection lines connected to the first to third local ground selection transistors. A first operation voltage may be provided to the first and second local ground selection lines, and a second operation voltage may be provided to the third local ground selection line.

According to example embodiments of inventive concepts, a nonvolatile memory device may include a plurality of first and second memory cells stacked in a direction perpendicular to a substrate, a first local ground selection transistor between the substrate and the plurality of first memory cells, a second local ground selection transistor between the substrate and the plurality of second memory cells, a first path transistor configured to provide at least one operation voltage to the first local ground selection transistor, and a second path transistor configured to provide at least one operation voltage to the second local ground selection transistor.

According to example embodiments of inventive concepts, a nonvolatile memory device may include first memory cells stacked in a direction perpendicular to a substrate, second memory cells stacked in the direction perpendicular to the substrate, third memory cells stacked in the direction perpendicular to the substrate, a first local ground selection transistor between the substrate and the first memory cells, a second local ground selection transistor between the substrate and the second memory cells, and a third local ground selection transistor between the substrate and the third memory cells. A first path transistor is connected to the first and second local ground selection transistors. The first path transistor is configured to provide at least one operation voltage to the first and second local ground selection transistors. A second path transistor is connected to the third local ground selection transistor. The second path transistor is configured to provide the at least one operation voltage to the third local ground selection transistor.

According to example embodiments of inventive concepts, a nonvolatile memory device includes first memory cells connected between a first ground selection transistor and a first string selection transistor and stacked in a direction perpendicular to a substrate; second memory cells connected between a second ground selection transistor and a second string selection transistor and stacked in a direction perpendicular to the substrate; and a plurality of path transistors providing an operation voltage to the first and second string selection transistors and the first and second ground selection transistors, wherein the first string selection transistor and the first ground selection transistor are connected to a first path transistor, and the second string selection transistor and the second ground selection transistor are connected to a second path transistor.

According to example embodiments of inventive concepts, a nonvolatile memory device includes first memory cells connected between a first ground selection transistor and a first string selection transistor and stacked in a direction perpendicular to a substrate; second memory cells connected between a second ground selection transistors and a second string selection transistor and stacked in the direction perpendicular to the substrate; and a plurality of path transistors configured to provide at least one operation voltage to the first and second string selection transistors and the first and second ground selection transistors, where the first string selection transistor and the first ground selection transistor are connected to a first path transistor, and the second string selection transistor and the second ground selection transistor are connected to a second path transistor.

According to example embodiments of inventive concepts, a nonvolatile memory device includes M rows×N columns of NAND strings on a substrate, and a driver circuit. Each NAND string includes a string selection transistor, 1 to K memory cells, a local ground selection transistor, and a global ground selection transistor on the substrate. Also, M, N, and K are each independently integers greater than 1. The driver circuit is configured to select one of the M rows of NAND strings and to provide a first voltage to each string selection transistor and each local ground selection transistor of the selected one of the M rows of NAND strings. The driver circuit is configured to unselect M−1 rows of the M rows of NAND strings and to apply a second voltage to each string selection transistor and each local ground selection transistor of the unselected M−1 rows of the M rows of NAND strings. The second voltage is different than the first voltage.

According to example embodiments of inventive concepts, a solid state drive or a memory card may include the foregoing nonvolatile memory device and a memory controller.

BRIEF DESCRIPTION OF THE FIGURES

The above and other objects and features will become apparent from the following description of non-limiting embodiments of inventive concepts, as illustrated in the accompanying drawings in which like reference numerals refer to the same parts throughout the various figures unless otherwise specified. The drawings are not necessarily to scale, emphasis instead being placed upon illustrating the principles of inventive concepts. In the drawings.

DETAILED DESCRIPTION

Figure 1:
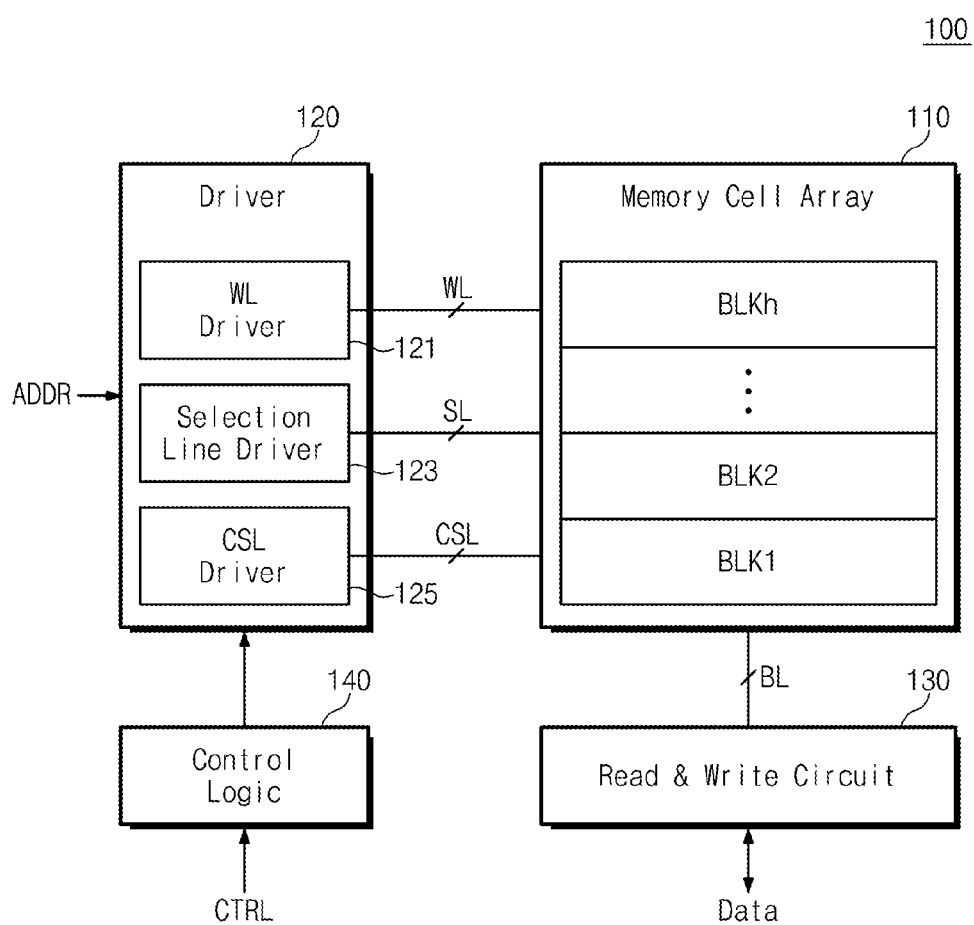
FIG. 1 is a block diagram schematically illustrating a nonvolatile memory device according example embodiments of inventive concepts.

Example embodiments of inventive concepts will be described in more detail with reference to the accompanying drawings, in which some example embodiments of inventive concepts are shown. Example embodiments of inventive concepts, however, may be embodied in various different forms, and should not be construed as being limited only to the illustrated embodiments. Rather, these embodiments are provided as examples so that this disclosure will be thorough and complete, and will fully convey the scope of example embodiments of inventive concepts to those skilled in the art. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments of inventive concepts.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of example embodiments of inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a nonvolatile memory device according to example embodiments of inventive concepts. Referring to FIG. 1, a nonvolatile memory device 100 may include a memory cell array 110, a driver 120, a read/write circuit 130, and control logic 140.

The memory cell array 110 may be connected to the driver 120 via word lines WL and to the read/write circuit 130 via bit lines BL. The memory cell array 110 may include a plurality of memory cells. In example embodiments, memory cells arranged in a row direction may be connected to the word lines WL. Memory cells arranged in a column direction may be connected to the bit lines BL. The memory cells in the memory cell array 110 may be configured to store one or more bits per cell.

The memory cell array 110 may include a plurality of memory blocks BLK1 to BLKh, each of which includes a plurality of memory cells. Each of the memory blocks BLK1 to BLKh may include a plurality of word lines WL, a plurality of string selection lines SSL, a plurality of ground selection lines GSL, and at least one common source line CSL.

The driver 120 may be connected to the memory cell array 110 via the word lines WL. The driver 120 may be configured to operate responsive to the control of the control logic 140. The driver 120 may receive an address ADDR from an external device.

The driver 120 may be configured to decode the input address ADDR. The driver 120 may select word lines WL, string selection lines SSL, ground selection lines GSL, and a common source line CSL using the decoded address.

The driver 120 may include a word line driver 121, a selection line driver 123, and a common source line driver 125.

The word line driver 121 may provide voltages to selected and unselected word lines. For example, at programming, erasing, or reading, the driver 120 may provide the word lines with a program operation voltage associated with a program operation, a read operation voltage associated with a read operation, or an erase operation voltage associated with an erase operation. For example, the word line driver 121 may be configured to select the word lines and to provide operation voltages to the word lines.

The selection line driver 123 may be configured to provide operation voltages to a selection line SL. That is, the selection line driver 123 may select a string selection line SSL and a ground selection line GSL to provide operation voltages according to a selection result.

The common source line driver 125 may provide an operation voltage to the common source line CSL.

The read/write circuit 130 may be connected to the memory cell array 110 via the bit lines BL. The read/write circuit 130 may operate responsive to the control of the control logic 140. The read/write circuit 130 may select the bit lines BL.

The read/write circuit 130 may receive data from the outside of the nonvolatile memory device 100 to write it in the memory cell array 110. The read/write circuit 130 may read data from the memory cell array 110 to transfer the read data to the external device. The read/write circuit 130 may read data from a first storage area of the memory cell array 110 to write the data in a second storage area of the memory cell array 110. For example, the read/write circuit 130 may be configured to support a copy-back operation.

The read/write circuit 130 may include elements such as a page buffer, (or, a page register), a column selector, a data buffer, and the like. In example embodiments, the read/write circuit 130 may include elements such as a sense amplifier, a write driver, a column selector, a data buffer, and the like.

The control logic 140 may be connected to the driver 120 and the read/write circuit 130. The control logic 140 may be configured to control an overall operation of the nonvolatile memory device 100. The control logic 140 may operate responsive to a control signal CTRL provided from the external device.

Figure 2:
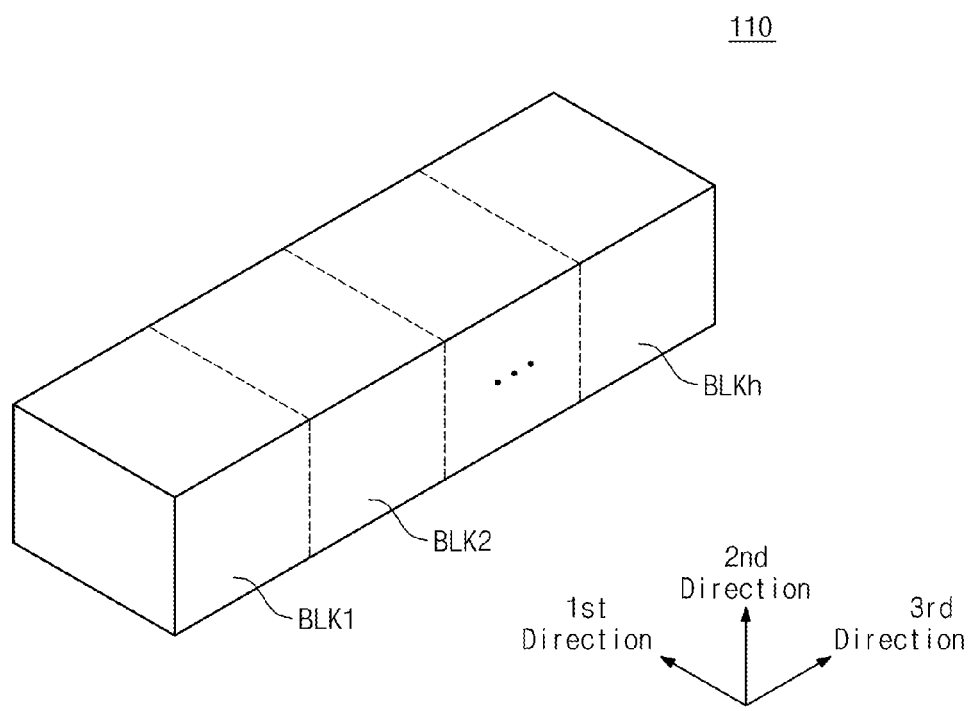
FIG. 2 is a diagram schematically illustrating a memory cell array in FIG. 1 according example embodiments of inventive concepts.

FIG. 2 is a diagram schematically illustrating a memory cell array in FIG. 1 according to example embodiments of inventive concepts. Referring to FIG. 2, a memory cell array 110 may include a plurality of memory blocks BLK1 to BLKh, each of which is formed to have a three-dimensional structure (or, a vertical structure). For example, each of the memory blocks BLK1 to BLKh may include structures extending along first to third directions. For example, each of the memory blocks BLK1 to BLKh may include a plurality of NAND strings extending along the second direction. For example, a plurality of NAND strings NS may be provided along the first and third directions.

Each NAND string NS may be connected to a bit line, a string selection line, a ground selection line, word lines, and a common source line. That is, each memory block may be connected to a plurality of bit lines, a plurality of string selection lines, a plurality of ground selection lines, and a plurality of common source lines. Each memory block will be more fully described with reference to FIG. 3.

Figure 3:
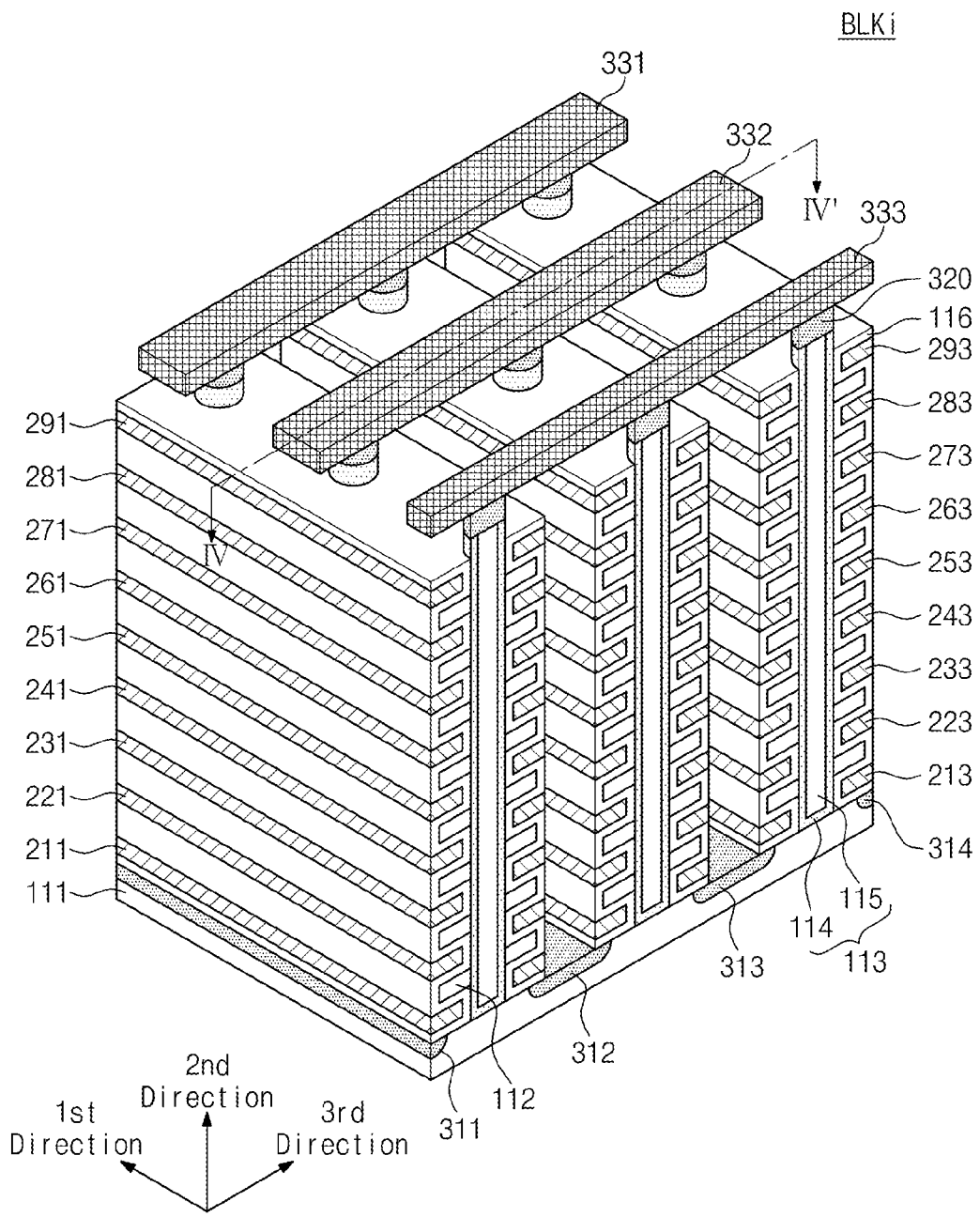
FIG. 3 is a perspective view of a part of a memory block in FIG. 2 according to example embodiments of inventive concepts.
Figure 4:
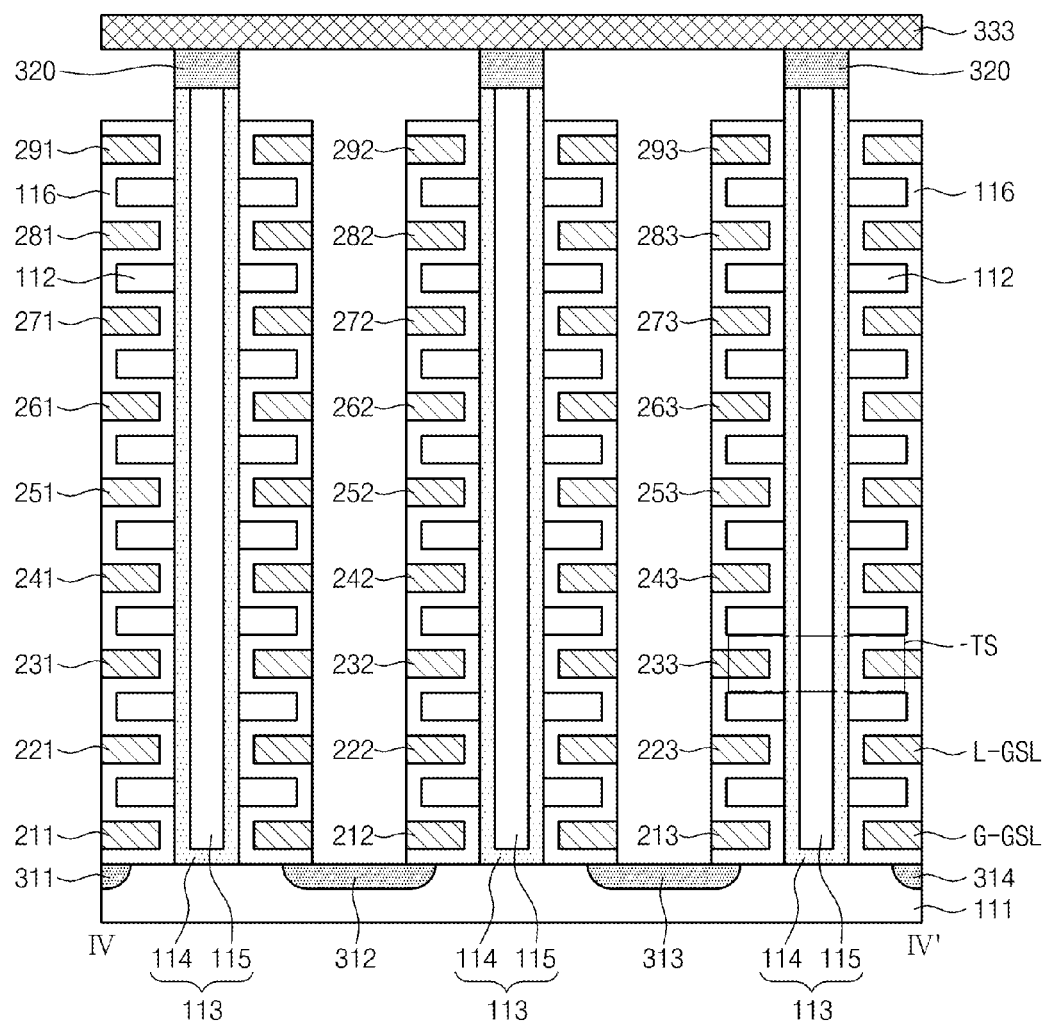
FIG. 4 is a cross-sectional view taken along a line IV-IV' of FIG. 3.

FIG. 3 is a perspective view of a part of a memory block in FIG. 2 according to example embodiments of inventive concepts, and FIG. 4 is a cross-sectional view taken along a line IV-IV' of FIG. 3. Referring to FIGS. 3 and 4, a memory block BLKi may include structures that extend along first to third directions.

First, a substrate 111 may be provided. The substrate 111 may include a silicon material doped with a first-type impurity. For example, the substrate 111 may include a silicon material doped with a p-type impurity. For example, the substrate 111 may be a p-well (or, a pocket p-well). Below, it is assumed that the substrate 111 is p-type silicon. However, the substrate 111 is not limited thereto.

A plurality of wells 311 to 314 extending along the first direction may be provided at the substrate 111. For example, a plurality of wells 311 to 314 may be second-type wells different from the substrate 111. For example, the wells 311 to 315 may be n-type wells. Hereinafter, it is assumed that the first to fourth wells 311 to 314 are n-type wells. However, the first to fourth wells 311 to 314 are not limited thereto.

On the substrate 111 between the first and second n-wells 311 and 312, a plurality of insulating materials 112 extending along the first direction may be sequentially provided along the second direction. For example, the plurality of insulating materials 112 and the substrate 111 may be spaced apart along the second direction.

For example, the plurality of insulating materials 112 may be formed to be separated by a desired (and/or alternatively predetermined) distance along the second direction. The insulating materials 112 may include an insulating material such as silicon oxide, but example embodiments are not limited thereto.

On the substrate 111 between the first and second n-wells 311 and 312, a plurality of pillars 113 may be provided which are sequentially disposed along the first direction and pass through the insulating materials 112 along the second direction. In example embodiments, the pillars 113 may contact with the substrate 111 through the insulating materials 112, respectively.

In example embodiments, each of the pillars 113 may be formed of a plurality of materials. For example, a surface layer 114 of each pillar 113 may include a first-type silicon material. For example, the surface layer 114 of each pillar 113 may include a silicon material doped with the same type as the substrate 111. Hereinafter, it is assumed that the surface layer 114 of each pillar 113 includes p-type silicon. However, the surface layer 114 of each pillar 113 is not limited thereto.

An inner layer 115 of each pillar 113 may be formed of an insulating material. For example, the inner layer 115 of each pillar 113 may include an insulating material such as silicon oxide.

Between the first and second n-wells 311 and 312, an insulating film 116 may be provided along exposed surfaces of the substrate 111, the insulating materials 112, and the pillars 113. For example, the thickness of the insulating film 116 may be less than half a distance between the insulating materials 112. That is, a region where a material other than the insulating materials 112 and the insulation layer 116 is disposed may be provided between an insulating film 116 provided on a lower surface of a first insulating material among the insulating materials 112 and an insulating film 116 provided on an upper surface of a second insulating material and at the lower portion of the first insulating material.

Between the first and second n-wells 311 and 312, conductive materials 211 to 291 may be provided on an exposed surface of the insulating film 116. For example, a conductive material 211 extending along the first direction may be provided between the substrate 111 and the insulating material 112 adjacent to the substrate 111. In detail, the conductive material 211 extending along the first direction may be provided between the substrate 111 and the insulating film 116 at a lower surface of the insulating material adjacent to the substrate 111.

A conductive material extending along the first direction may be provided between an insulating film 116 on an upper surface of a specific insulating material of the insulating materials 112 and an insulating film 116 on a lower surface of an insulating material disposed at a top of the specific insulating material.

A plurality of conductive materials 221 to 281 extending along the first direction may be provided among the insulating materials 112. Further, a conductive material 291 extending along the first direction may be provided on the insulating materials 112. The conductive materials 211 to 291 may be a metal material or a non-metal, such as polysilicon.

The same structure as that on the first and second n-wells 311 and 312 may be provided between the second and third n-wells 312 and 313. Between the second and third n-wells 312 and 313, there may be provided the insulating materials 112 extending along the first direction, the pillars 113 sequentially disposed in the first direction and passing through the insulating materials 112 along the second direction, the insulating film 116 provided on exposed surfaces of the pillars 113 and the insulating materials 112, and the conductive materials 212 to 292 extending along the first direction. The same structure as that on the first and second n-wells 311 and 312 may be provided between the third and fourth n-wells 313 and 314. Between the third and fourth n-wells 313 and 314, there may be provided the insulating materials 112 extending along the first direction, the pillars 113 sequentially disposed in the first direction and passing through the insulating materials 112 in the third direction, the insulation layer 116 provided on the exposed surfaces of the insulating materials 112 and the pillars 113, and the first conductive materials 213 to 293 extending along the first direction.

Drains 320 may be provided on the pillars 113, respectively. In example embodiments, the drains 320 may include a second-type silicon material. For example, the drains 320 may be an n-type silicon material. Hereinafter, it is assumed that the drains 320 include an n-type silicon material. However, the drains 320 are not limited thereto. In example embodiments, a width of each drain 320 may be wider than that of a corresponding pillar 113. For example, each drain 320 may be provided on a corresponding pillar 113 to have a pad shape.

Conductive materials 331 to 333 extending along the third direction may be provided on the drains 320. The conductive materials 331 to 333 may be sequentially disposed along the first direction. The conductive materials 331 to 333 may be connected to the drains 320 of corresponding regions, respectively. In example embodiments, the drains 320 and the second conductive material 333 extending along the third direction may be connected through contact plugs. The conductive materials 331 to 333 may be a metal material or polysilicon.

In FIGS. 3 and 4, each pillar 113 may form a string together with an adjacent region of an insulating film 116 and an adjacent region among the conductive lines 211 to 291, 212 to 292, and 213 to 293 extending along the first direction. For example, each pillar 113 may form a NAND string NS together with an adjacent region of an insulating film 116 and an adjacent region among the conductive lines 211 to 291, 212 to 292, and 213 to 293 extending along the first direction. The NAND string NS may include a plurality of transistor structures TS. The transistor structure TS will be more fully described with reference to FIG. 5. A local ground selection line L-GSL may be connected in common to conductive lines (e.g., 221-223) in the same row. A global ground selection line G-GSL may be connected in common to conductive lines (e.g., 211-213) in the same row and column. The local ground selection line and the global selection line is more fully described with reference to FIG. 6.

Figure 5:
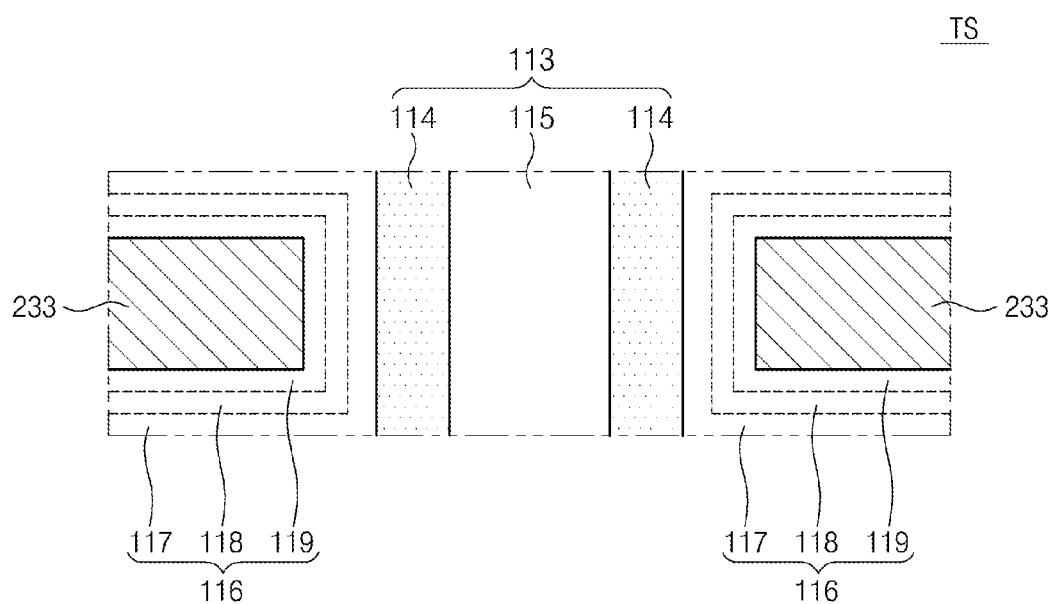
FIG. 5 is a cross-sectional view of a transistor structure TS in FIG. 4.

FIG. 5 is a cross-sectional view of a transistor structure TS in FIG. 4. Referring to FIGS. 3 to 5, an insulating film 116 may include at least three sub-insulating films 117, 118, and 119. The sub-insulating film 119 adjacent to a conductive material 233 extending along a first direction may act as a blocking insulating film. The sub-insulating film 117 adjacent to a pillar 113 may be a silicon oxide film. The sub-insulating film 118 between the sub-insulating films 117 and 119 may be a silicon nitride film. That is, the insulating film 116 may have an ONO (Oxide-Nitride-Oxide) structure.

The conductive material 233 may serve as a gate (or a control gate). The sub-insulating film 119 adjacent to the conductive material 233 may act as a blocking insulating film. The sub-insulating film 118 may act as a charge storage film. For example, the second sub-insulating film 118 may act as a charge trap layer. The sub-insulating film 117 adjacent to the pillar 113 may act as a tunneling insulating film. A p-type surface layer 114 of the pillar 113 may serve as a body. That is, the conductive material 233, the sub-insulating film 119, the sub-insulating film 118, the sub-insulating film 117, and the p-type surface layer 114 may form a transistor (or, a memory cell transistor structure). Hereinafter, the p-type surface layer 114 of the pillar 113 may be referred to as a second-direction body.

A memory block BLKi may include a plurality of pillars 113. That is, the memory block BLKi may include a plurality of NAND strings NS. In detail, the memory block BLKi may include a plurality of NAND strings NS extending along a second direction (or, a direction vertical to a substrate).

Each NAND string NS may include a plurality of transistor structures TS that are disposed along a second direction. At least one of the transistor structures TS of each NAND string NS may serve as a string selection transistor SST. At least one of the transistor structures TS of each NAND string NS may serve as a ground selection transistor GST.

Gates (or control gates) may correspond to conductive materials 211 to 291, 212 to 292, and 213 to 293 extending along a first direction. That is, the gates (or the control gates) may be extended in the first direction to form two selection lines (e.g., at least one string selection line SSL and at least one ground selection line GSL) and word lines extending along the first direction.

Conductive materials 331 through 333 extending in a third direction may be connected to one ends of the NAND strings NS, respectively. Conductive materials 331 through 333 may act as bit lines BL. In the memory block BLK1, one bit line may be connected with a plurality of NAND strings.

Second-type wells 311 to 314 extending in the first direction may be provided to other ends of the NAND strings NS, respectively. The second-type wells 311 to 314 may serve as common source lines CSL.

To sum up the above description, the memory block BLKi may include a plurality of NAND strings that extend in a direction (i.e., the second direction) vertical to the substrate 111, and may be a NAND flash memory block (e.g., a charge trap type) in which a plurality of NAND strings NS may be connected to one bit line BL.

While FIGS. 3 to 5 illustrate the first conductive lines 211 to 291, 212 to 292, and 213 to 293 extending along the first direction are formed at nine layers, example embodiments of inventive concepts are not limited thereto. For example, conductive lines extending along the first direction may be provided at 8, 16, or plural layers. That is, one NAND string may include 8, 16, or plural transistors.

While FIGS. 3 through 5 illustrate three NAND strings NS are connected to a bit line, example embodiments of inventive concepts are not limited thereto. According to example embodiments of inventive concepts, in a memory block BLKi, m NAND strings NS may be connected to a bit line BL. At this time, the number of conductive materials 211 to 291, 212 to 292, and 213 to 293 extending along the first direction and the number of common source lines 311 to 314 may be adjusted according to the number of NAND strings NS connected to a bit line BL.

While FIGS. 3 through 5 illustrate three NAND strings NS connected to a conductive material extending along the first direction, example embodiments of inventive concepts are not limited thereto. For example, n NAND strings NS may be connected to a conductive material extending along the first direction. At this time, the number of bit lines 331 to 333 may be adjusted according to the number of NAND strings connected to a bit line extending along the first direction.

A three-dimensional NAND flash memory device described in relation to FIGS. 1 to 5 may have a shared word line structure within a memory block. In case of the three-dimensional NAND flash memory device, word line setup may be generated at unselected NAND strings due to the shared word line structure. At this time, since channels of all NAND strings are formed, loading of a word line supplied with a read voltage at a read or program verification operation may increase. That is, a long time may be taken to set up a word line, so that the read performance of a nonvolatile memory device may be lowered. Below, example embodiments of inventive concepts for reducing word line loading at reading or program verifying will be more fully described.

Figure 6:
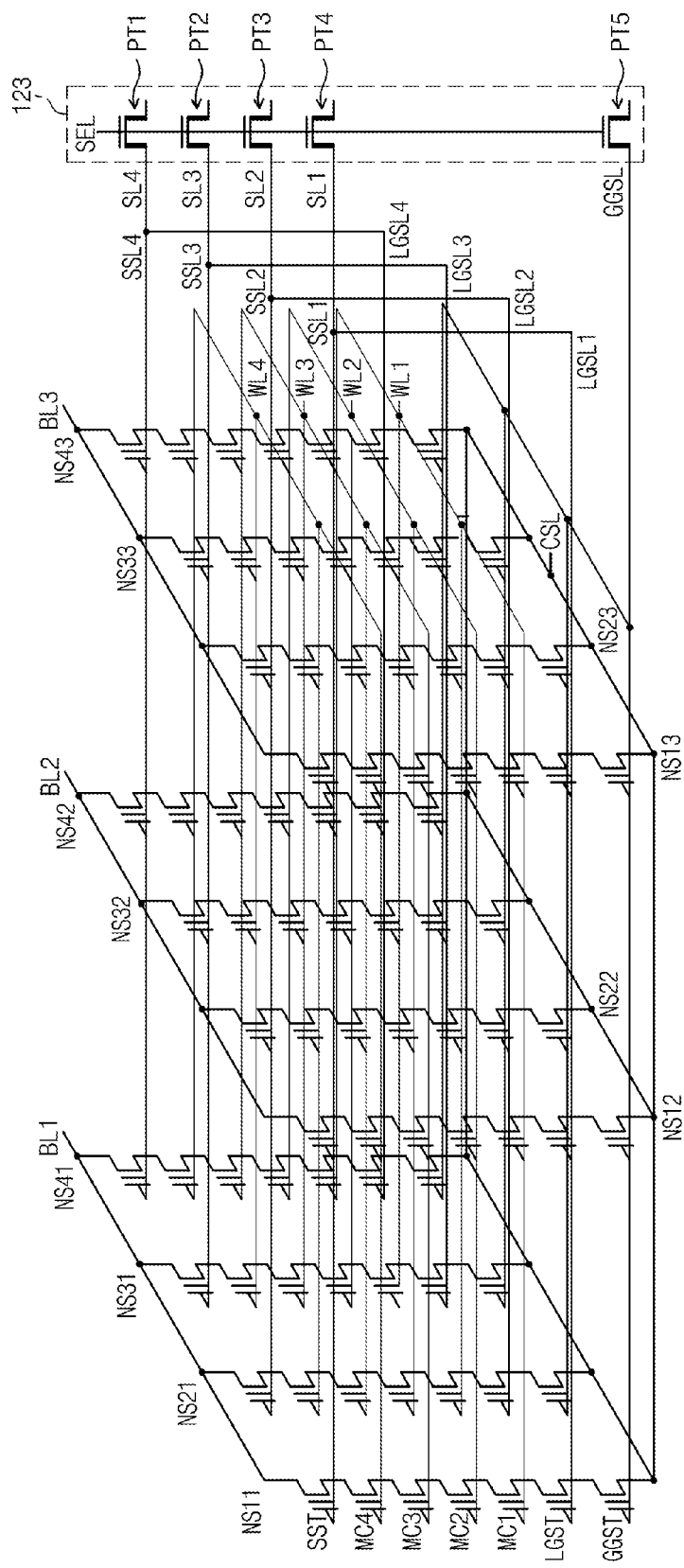
FIG. 6 is an equivalent circuit diagram of a memory cell array of a nonvolatile memory device according to example embodiments of inventive concepts.

FIG. 6 is an equivalent circuit diagram of a memory cell array of a nonvolatile memory device according to example embodiments of inventive concepts. One memory block (e.g., BLK1) of FIG. 1 is illustrated in FIG. 6. Further, a part of a selection line driver 123 in FIG. 1, that is, a plurality of path transistors PT1 to PT5 are illustrated in FIG. 6.

Referring to FIG. 6, NAND strings NS11, NS21, NS31, and NS41 may be provided between a first bit line BL1 and a common source line CSL. The first bit line BL1 may correspond to a conductive material 331 (refer to FIG. 3) extending along a third direction. NAND strings NS12, NS22, NS32, and NS42 may be provided between a second bit line BL2 and the common source line CSL. The second bit line BL2 may correspond to a conductive material 332 (refer to FIG. 3) extending along the third direction. NAND strings NS13, NS23, NS33, and NS43 may be provided between a third bit line BL3 and the common source line CSL. The third bit line BL3 may correspond to a conductive material 333 (refer to FIG. 3) extending in the third direction.

Each NAND string NS may include a string selection transistor SST that is connected to a corresponding bit line BL. In each NAND string NS, memory cells MC1 to MC4 may be provided between a string selection transistor SST and a ground selection transistor GST. For example, a plurality of memory cells MC1 to MC4 may be provided between a global ground selection transistor GGST and a local ground selection transistor LGST.

Below, NAND strings NS may be defined by the row and by the column. The NAND strings NS connected to one bit line in common may form one column. For example, the NAND strings NS11 to NS41 connected to the first bit line BL1 may correspond to a first column. The NAND strings NS12 to NS42 connected to the second bit line BL2 may correspond to a second column. The NAND strings NS13 to NS43 connected to the third bit line BL3 may correspond to a third column.

The NAND strings NS connected to one string selection line SSL may form one row. For example, the NAND strings NS11, NS12, and NS13 connected to a first string selection line SSL1 may form a first row. The NAND strings NS21, NS22, and NS23 connected to a second string selection line SSL2 may form a second row. The NAND strings NS31, NS32, and NS33 connected to a third string selection line SSL3 may form a third row. The NAND strings NS41, NS42, and NS43 connected to a third string selection line SSL3 may form a fourth row.

In each NAND string NS, a height may be defined. In example embodiments, in each NAND string NS, a memory cell MC1 adjacent to the global or local ground selection transistor GGST or LGST may be defined to have a height of 1. In each NAND string NS, a height of a memory cell may increase in inverse proportion to a distance from a string selection transistor SST. In each NAND string NS, a memory cell MC4 adjacent to the string selection transistor SST may be defined to have a height of 4.

NAND strings NS in the same row may share a string selection line SSL. NAND strings NS in different rows may be connected to different string selection lines SSL. For example, NAND strings NS11, NS12, and NS13 may share a string selection line SSL1. NAND strings NS11, NS12, and NS13 may be connected to the string selection line SSL1 different from a string selection line SSL2 shared by NAND strings NS21, NS22, and NS23.

In NAND strings NS of the same row, memory cells having the same height may share a word line. At the same height, word lines WL of NAND strings NS in different rows may be connected in common. For example, word lines WL1 may be connected in common at a layer where conductive materials extending in a first direction are provided. In example embodiments, conductive materials extending in the first direction may be connected at an upper layer via contacts. Conductive materials extending in the first direction may be connected in common at an upper layer.

A common source line CSL may be connected in common to NAND strings NS. For example, first to fourth n-wells 311 to 314 (refer to FIG. 3) may be connected at an active region of a substrate 111 (refer to FIG. 3). For example, the first to fourth n-wells 311 to 314 may be connected to an upper layer via contacts. The first to fourth n-wells 311 to 314 may be connected in common at an upper layer.

A global ground selection line GGSL may be connected in common to NAND strings NS11 to NS41, NS12 to NS42, and NS13 to NS43 by connecting global ground selection transistors GGST of the NAND strings NS11 to NS41, NS12 to NS42, and NS13 to NS43. A local ground selection line LGSL may be connected in common to a plurality of NAND strings NS. For example, a first local ground selection line LGSL1 may be connected in common to NAND strings NS11, NS12, and NS13 in the same row. Likewise, each of second to fourth local ground selection lines LGSL2 to LGSL4 may be connected in common to NAND strings in the same row.

Continuing to refer to FIG. 6, a nonvolatile memory device 100 (refer to FIG. 1) may include a selection line driver 123. The selection line driver 123 may include a plurality of path transistors PT1 to PT5. The path transistors PT1 to PT5 may respond to a selection signal SEL to provide a selection line selection voltage to selection lines SL1 to SL4 and GGSL.

The nonvolatile memory device 100 may be configured such that a string selection line (e.g., SSL1) and a local ground selection line (e.g., LGSL1) are connected to a selection line (e.g., SL1). Herein, a first local ground selection line LGSL1 may be a line connecting local ground selection transistors in the same row. The first local ground selection line LGSL1 and the first string selection line SSL1 may be connected to the same path transistor PT4 via the first selection line SL1.

Likewise, a second local ground selection line LGSL2 and a second string selection line SSL2 may be connected to the same path transistor PT3 via a second selection line SL2. A third local ground selection line LGSL3 and a third string selection line SSL3 may be connected to the same path transistor PT2 via a third selection line SL3. A fourth local ground selection line LGSL4 and a fourth string selection line SSL4 may be connected to the same path transistor PT1 via a fourth selection line SL4.

It is assumed that a first NAND string includes a first string selection transistor, a first local ground selection transistor, and first memory cells stacked in a direction perpendicular to a substrate. Further, it is assumed that a second NAND string is located at a row different from the first NAND string and includes a second string selection transistor, a second local ground selection transistor, and second memory cells stacked in a direction perpendicular to a substrate.

In example embodiments, the first and second local ground selection transistors may be electrically isolated from each other. The first and second local ground selection transistors electrically isolated may be connected to different path transistors PT1 to PT4 of the selection line driver 123, respectively. The first and second string selection transistors may be electrically isolated from each other, and may be connected to different path transistors PT1 to PT4.

Referring to FIG. 6, a local ground selection line and a string selection line in the same row may be electrically connected so as to be connected to the same path transistor. Thus, a first string selection transistor and a first local ground selection transistor may be supplied with the same selection line selection voltage.

The global ground selection line GGSL may be connected to NAND strings NS by connecting global ground selection transistors GGST of NAND strings NS. For example, the first NAND string may further include a first global ground selection transistor, and the second NAND string may further include a second global ground selection transistor. The global ground selection line GGSL may be connected in common to the first and second global ground selection transistors. The global ground selection line GGSL may be connected to a fifth path transistor PT5 of the selection line driver 123.

Referring to FIG. 6, word lines WL at the same height may be connected in common. Thus, when a specific word line WL is selected, all NAND strings NS connected to the specific word line WL may be selected. NAND strings NS in different rows may be connected to different string selection lines SSL. Thus, NAND strings NS in unselected rows from among NAND strings connected to the same word line WL may be separated from bit lines BL1 to BL3 by selecting string selection lines SSL1 to SSL4. That is, a row of NAND strings NS may be selected by selecting string selection lines SSL1 to SSL4. NAND strings NS in a selected row may be selected by the column by selecting bit lines BL1 to BL3.

As illustrated in FIG. 6, the nonvolatile memory device 100 according to example embodiments of inventive concepts may be configured such that a local ground selection line (e.g., LGSL1) and a corresponding string selection line (e.g., SSL1) are connected to one selection line (e.g., SL1). Selection lines may be connected to different path transistors PT1 to PT4. The nonvolatile memory device in FIG. 6 may provide the same bias voltage to a local ground selection line and a corresponding string selection line.

The nonvolatile memory device in FIG. 6 may include a global ground selection transistor GGST between a local ground selection transistor LGST and a common source line CSL. Example embodiments of inventive concepts may satisfy a bias voltage condition by providing the same bias voltage to a local ground selection line and a string selection line at reading or writing using the global ground selection transistor GGST.

Figure 7:
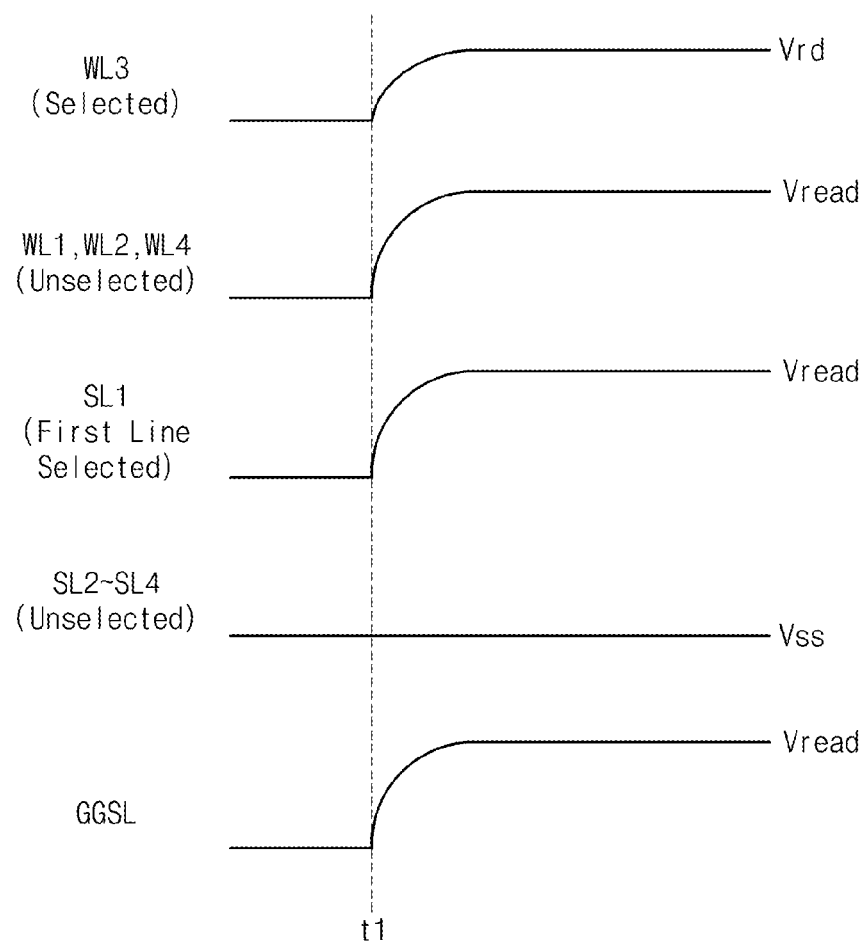
FIG. 7 is a timing diagram illustrating a bias voltage condition of a memory cell array in FIG. 6 at a read operation of a nonvolatile memory device.

FIG. 7 is a timing diagram illustrating a bias voltage condition of a memory cell array in FIG. 6 at a read operation of a nonvolatile memory device. Referring to FIGS. 6 and 7, at t1, a selection read voltage Vrd may be applied to a selected word line (e.g., WL3), and a non-selection read voltage Vread may be provided to unselected word lines (e.g., WL1, WL2, and WL4). The non-selection read voltage Vread may be a pass voltage sufficient to turn on a memory cell, and may be higher in level than the selection read voltage Vrd.

Referring to FIG. 7, the non-selection read voltage Vread may be applied to a first selection line SL1, and second to fourth selection lines SL2 to SL4 may be grounded. The non-selection read voltage Vread may be applied to a global ground selection line GGSL. At this time, there are grounded the second to fourth selection lines SL2 to SL4 for connecting local ground selection lines LGSL2 to LGSL4, corresponding to unselected memory cells in the selected word line WL3, and string selection lines SSL2 to SSL4 corresponding to the local ground selection lines LGSL2 to LGSL4.

Returning to FIG. 6, a nonvolatile memory device according to example embodiments of inventive concepts may be configured to separate a conventionally shared ground selection line into a plurality of local ground selection lines LGSL1 to LGSL4 and to separate selection voltage levels being applied to the local ground selection lines LGSL1 to LGSL4. Thus, a channel of a selected NAND string may be only formed. Further, example embodiments of inventive concepts may be configured to float unselected NAND strings. Thus, it is possible to reduce entire word line loading and a word line setup time.

At reading, capacitance of memory cells in unselected NAND strings may be reduced by applying the non-selection read voltage Vread (or, a pass voltage) only to a local ground selection line LGSL1 corresponding to a selected memory cell MC and applying a ground voltage Vss to local ground selection lines LGSL2 to LGSL4 corresponding to unselected memory cells. Thus, a time taken to load a voltage onto a word line may be shortened. Further, the number of path transistors may be reduced by connecting a string selection line and a corresponding local ground selection line to one selection line.

While FIG. 7 illustrates an example where word line WL3 is selected and supplied with read voltage Vr, the selection line SL1 is selected and supplied with the non-selection read voltage Vread, the word lines WL1, WL2, and WL4 are unselected and supplied with the non-selection read voltage Vread, and unselected selection lines SL2 to SL4 are grounded, example embodiments of inventive concepts are not limited thereto. For example, one of word lines WL1, WL2, and WL4 may be selected and supplied with the selection read voltage Vr instead of WL3, one of the selection lines SL2 to SL4 may be selected and provided with the non-selection read voltage Vread instead of selection line SL1. If unselected, an unselected word line WL3 may be supplied with the non-selection read voltage Vread, and an unselected selection line SL1 may be grounded.

Figure 8:
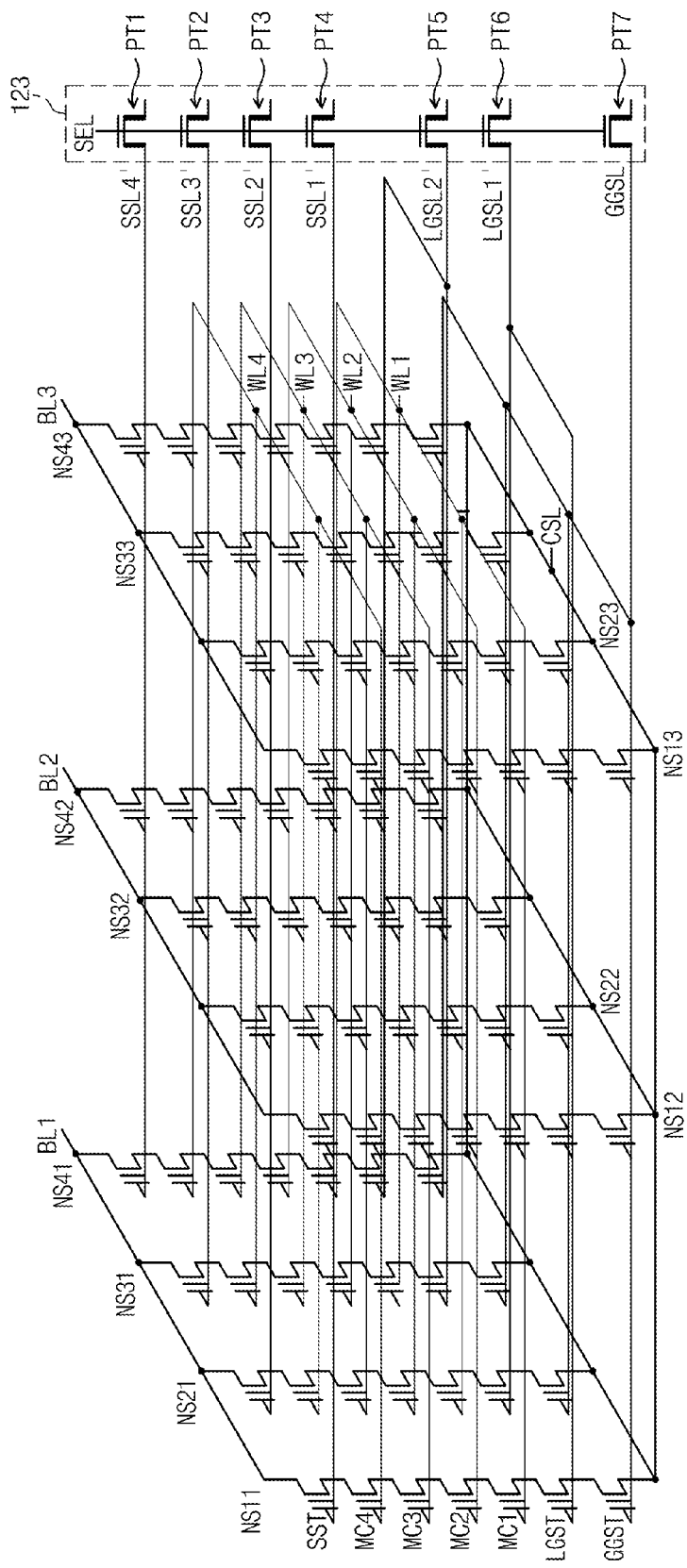
FIG. 8 is an equivalent circuit diagram of a memory cell array of a nonvolatile memory device according to example embodiments of inventive concepts.

FIG. 8 is an equivalent circuit diagram of a memory cell array of a nonvolatile memory device according to example embodiments of inventive concepts. Referring to FIG. 8, first to fourth string selection lines SSL1' to SSL4' may be connected to first to fourth path transistors PT1 to PT4, respectively. For example, the first string selection line SSL1' may be connected to the fourth path transistor PT4, and the second string selection line SSL2' may be connected to the third path transistor PT3.

A first local ground selection line LGSL1' may be connected in common to local ground selection transistors in NAND strings NS11, NS12, NS13, NS21, NS22, and NS23. The first local ground selection line LGSL1' may be connected to a sixth path transistor PT6. A second local ground selection line LGSL2' may be connected in common to local ground selection transistors in NAND strings NS31, NS32, NS33, NS41, NS42, and NS43. The second local ground selection line LGSL2' may be connected to a fifth path transistor PT5.

A global ground selection line GGSL may be connected in common to global ground selection transistors GGST in all NAND strings NS11 to NS43. In each NAND string, the global ground selection transistor GGST may be connected between a local ground selection transistor LGST and a common source line CSL. The global ground selection line GGSL may be connected to a seventh path transistor PT7.

Figure 9:
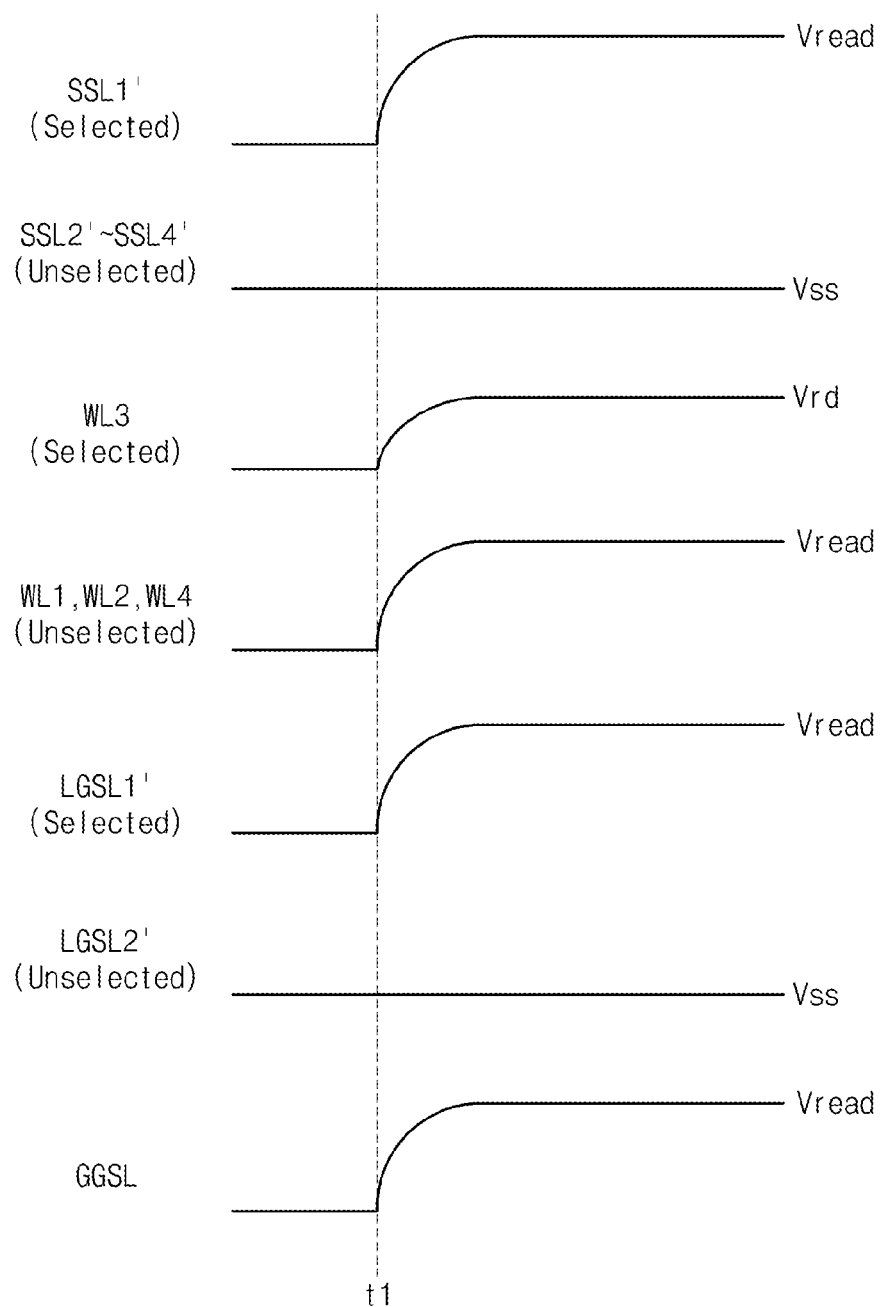
FIG. 9 is a timing diagram illustrating a bias voltage condition of a memory cell array in FIG. 8 at a read operation of a nonvolatile memory device.

FIG. 9 is a timing diagram illustrating a bias voltage condition of a memory cell array in FIG. 8 at a read operation of a nonvolatile memory device. Referring to FIGS. 8 and 9, at t1, a selection read voltage Vrd may be applied to a selected word line (e.g., WL3), and a non-selection read voltage Vread may be provided to unselected word lines (e.g., WL1, WL2, and WL4).

Referring to FIG. 9, the non-selection read voltage Vread may be applied to a selected string selection line SSL1', and unselected string selection lines SSL2' to SSL4' may be grounded. The non-selection read voltage Vread may be applied to a global ground selection line GGSL. The non-selection read voltage Vread may be applied to a local ground selection line LGSL1' connected to a NAND string (e.g., NS11) including memory cells of the selected word line WL3. A ground voltage Vss may be applied to a local ground selection line LGSL2' corresponding to unselected memory cells connected to the selected word line WL3.

Returning to FIG. 8, the nonvolatile memory device according to example embodiments of inventive concepts may be configured to separate a conventionally shared local ground selection line into a plurality of groups LGSL1' and LGSL2' and to separate selection voltage levels being applied to the local ground selection line groups. Thus, channels of NAND strings in a selected local ground selection line group may be only formed. Further, example embodiments of inventive concepts may be configured to float unselected NAND strings. Thus, it is possible to reduce entire word line loading and a word line setup time.

At reading, capacitance of memory cells in unselected NAND strings may be reduced by applying the non-selection read voltage Vread (or, a pass voltage) only to a local ground selection line LGSL1' corresponding to a selected memory cell MC and applying a ground voltage Vss to a local ground selection line LGSL2' corresponding to an unselected memory cell. Thus, a time taken to load a voltage onto a word line may be shortened. Further, the number of path transistors may be reduced by grouping a plurality of local ground selection lines.

While FIG. 9 illustrates an example where the word line WL3 is selected and supplied with the read voltage Vr, the string selection line SSL1' is selected and supplied with the non-selection read voltage Vread, the local ground selection line LGSL1' is selected and supplied with the non-selection read voltage Vread, the word lines WL1, WL2, and WL4 are unselected are supplied with the non-selection read voltage Vread, and the unselected string selection lines SSL2' to SSL4' and local ground selection line LGSL2' are grounded, example embodiments of inventive concepts are not limited thereto. For example, one of word lines WL1, WL2, and WL4 may be selected and supplied with the selection read voltage Vr instead of WL3, one of the selection lines SSL2' to SSL4' may be selected and be provided with the non-selection read voltage Vread instead of the string selection line SSL1', and the local ground selection line LGSL2' may be selected and provided with the non-selection read voltage Vread. If unselected, an unselected word line WL3 may be supplied with the non-selection read voltage Vread, an unselected string selection line SSL1' and local ground selection line LGSL1' may be grounded.

Figure 10:
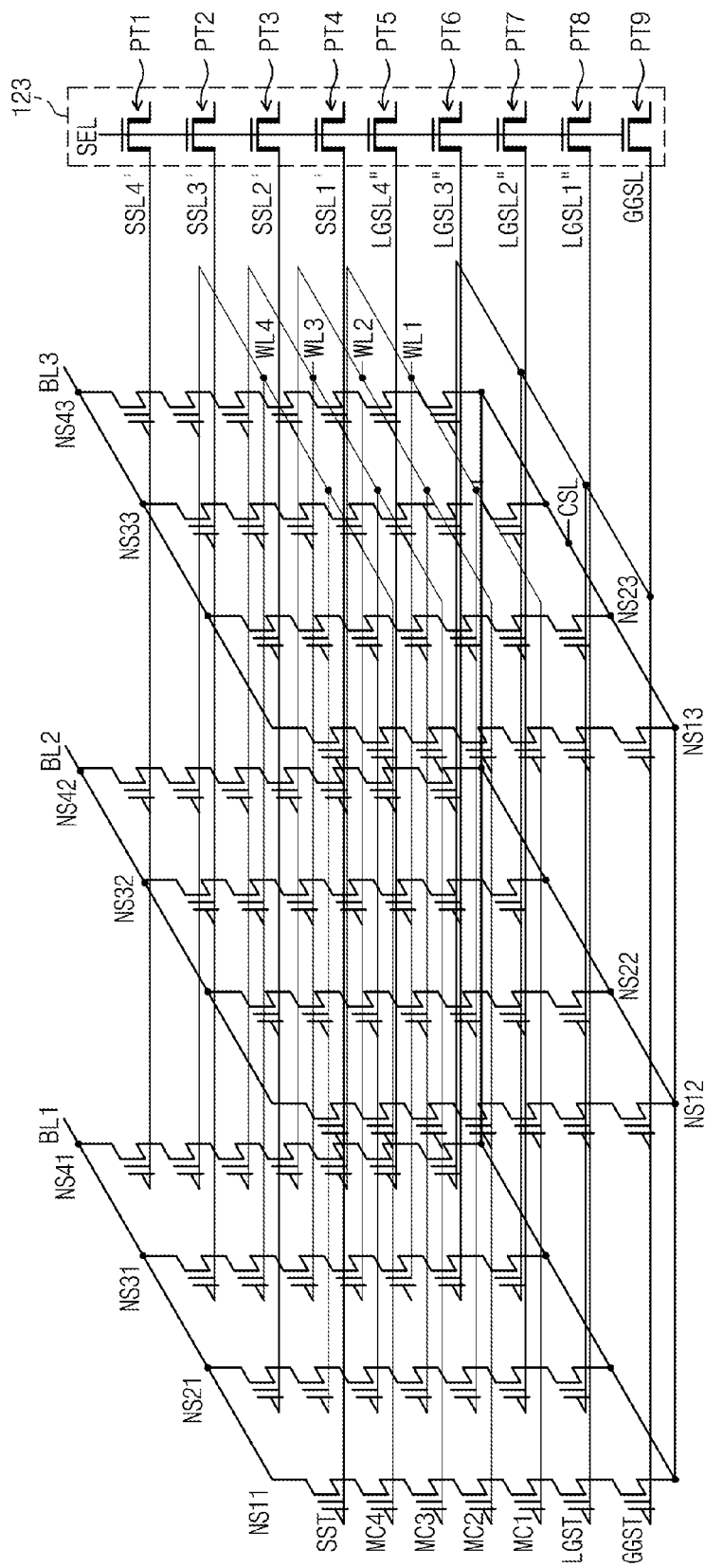
FIG. 10 is an equivalent circuit diagram of a memory cell array of a nonvolatile memory device according to example embodiments of inventive concepts.

FIG. 10 is an equivalent circuit diagram of a memory cell array of a nonvolatile memory device according to example embodiments of inventive concepts.

Referring to FIG. 10, first to fourth string selection lines SSL1' to SSL4' may be connected to first to fourth path transistors PT1 to PT4, respectively. For example, the first string selection line SSL1' may be connected to the fourth path transistor PT4, and the second string selection line SSL2' may be connected to the third path transistor PT3. The third string selection line SSL3' may be connected to the second path transistor PT2, and the fourth string selection line SSL4' may be connected to the first path transistor PT1.

First to fourth local ground selection lines LGSL1" to LGSL4" may be connected to fifth to eighth path transistors PT5 to PT8, respectively. For example, the first local ground selection line LGSL1" may be connected to the eighth path transistor PT8, and the second local ground selection line LGSL2" may be connected to the seventh path transistor PT7. The third local ground selection line LGSL3" may be connected to the sixth path transistor PT6, and the fourth local ground selection line LGSL4" may be connected to the fifth path transistor PT5.

A global ground selection line GGSL may be connected in common to global ground selection transistors GGST in all NAND strings NS11 to NS43. In each NAND string, the global ground selection transistor GGST may be connected between a local ground selection transistor LGST and a common source line CSL. The global ground selection line GGSL may be connected to a ninth path transistor PT9.

Figure 11:
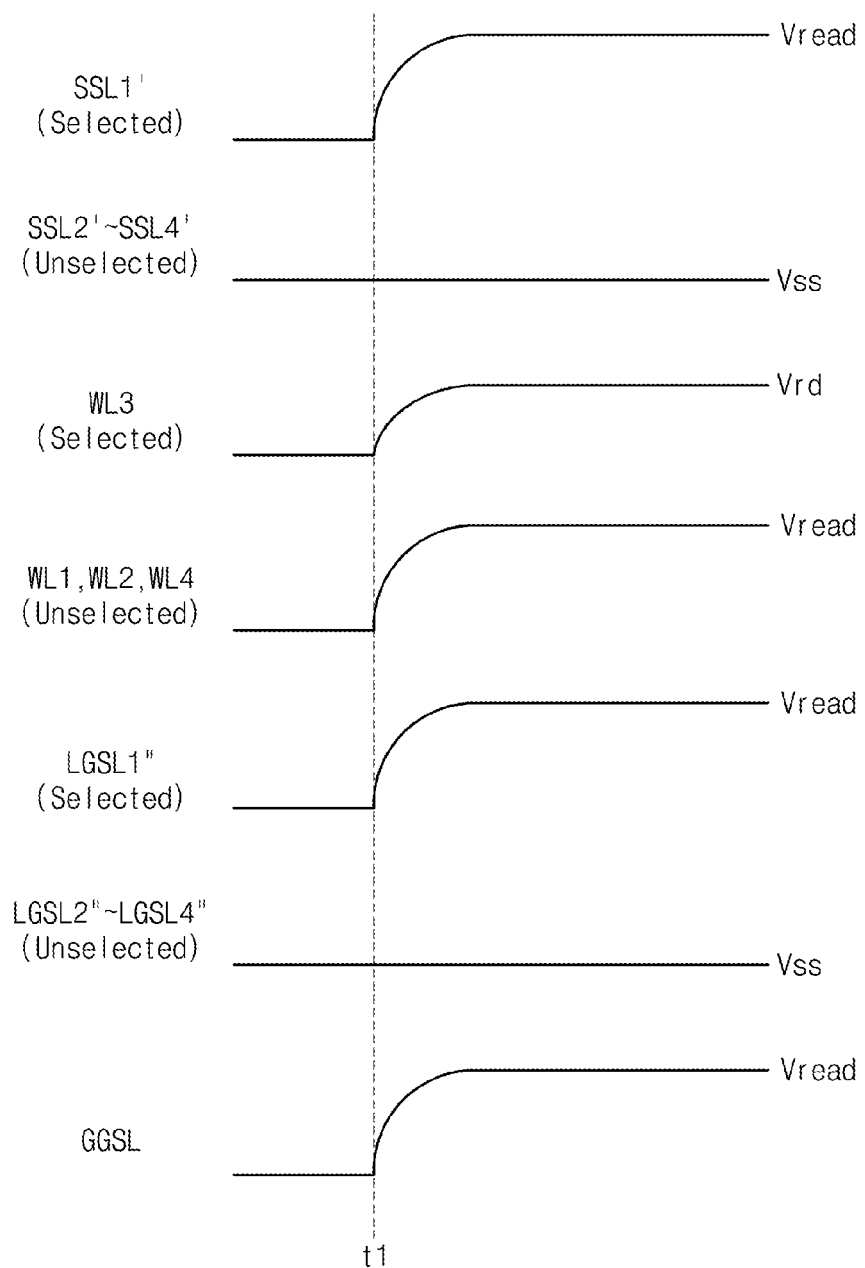
FIG. 11 is a timing diagram illustrating a bias voltage condition of a memory cell array in FIG. 10 at a read operation of a nonvolatile memory device.

FIG. 11 is a timing diagram illustrating a bias voltage condition of a memory cell array in FIG. 10 at a read operation of a nonvolatile memory device. Referring to FIGS. 10 and 11, at t1, a selection read voltage Vrd may be applied to a selected word line (e.g., WL3), and a non-selection read voltage Vread may be provided to unselected word lines (e.g., WL1, WL2, and WL4).

Referring to FIG. 11, the non-selection read voltage Vread may be applied to a selected string selection line (e.g., SSL1'), and unselected string selection lines SSL2' to SSL4' may be grounded. The non-selection read voltage Vread may be applied to a global ground selection line GGSL. The non-selection read voltage Vread may be applied to a selected local ground selection line (e.g., LGSL1"). A ground voltage Vss may be applied to unselected local ground selection lines LGSL2" to LGSL4".

While FIG. 11 illustrates an example where the word line WL3 is selected and supplied with the read voltage Vr, the string selection line SSL1' is selected and supplied with the non-selection read voltage Vread, the local ground selection line LGSL1" is selected and supplied with the non-selection read voltage Vread, the word lines WL1, WL2, and WL4 are unselected are supplied with the non-selection read voltage Vread, and the unselected string selection lines SSL2' to SSL4' and local ground selection lines LGSL2" to LGSL4" are grounded, example embodiments of inventive concepts are not limited thereto. For example, one of word lines WL1, WL2, and WL4 may be selected and supplied with the selection read voltage Vr instead of WL3, one of the selection lines SSL2' to SSL4' may be selected and be provided with the non-selection read voltage Vread instead of the string selection line SSL1', and one of the local ground selection lines LGSL2" to LGSL4" may be selected and provided with the non-selection read voltage Vread. If unselected, an unselected word line WL3 may be supplied with the non-selection read voltage Vread, an unselected string selection line SSL1' and local ground selection line LGSL1" may be grounded.

Returning to FIG. 10, the nonvolatile memory device according to example embodiments of inventive concepts may be configured to separate a conventionally shared ground selection line into a plurality of local ground selection lines and to separate selection voltage levels being applied to the local ground selection lines. Thus, channels of NAND strings in a selected local ground selection line may be only formed. Further, example embodiments of inventive concepts may be configured to float unselected NAND strings. Thus, it is possible to reduce entire word line loading and a word line setup time.

At reading, capacitance of memory cells in unselected NAND strings may be reduced by applying the non-selection read voltage Vread (or, a pass voltage) only to a local ground selection line LGSL1" corresponding to a selected memory cell MC and applying a ground voltage Vss to local ground selection lines LGSL2" to LGSL4" corresponding to unselected memory cells. Thus, a time taken to load a voltage onto a word line may be shortened.

Figure 12:
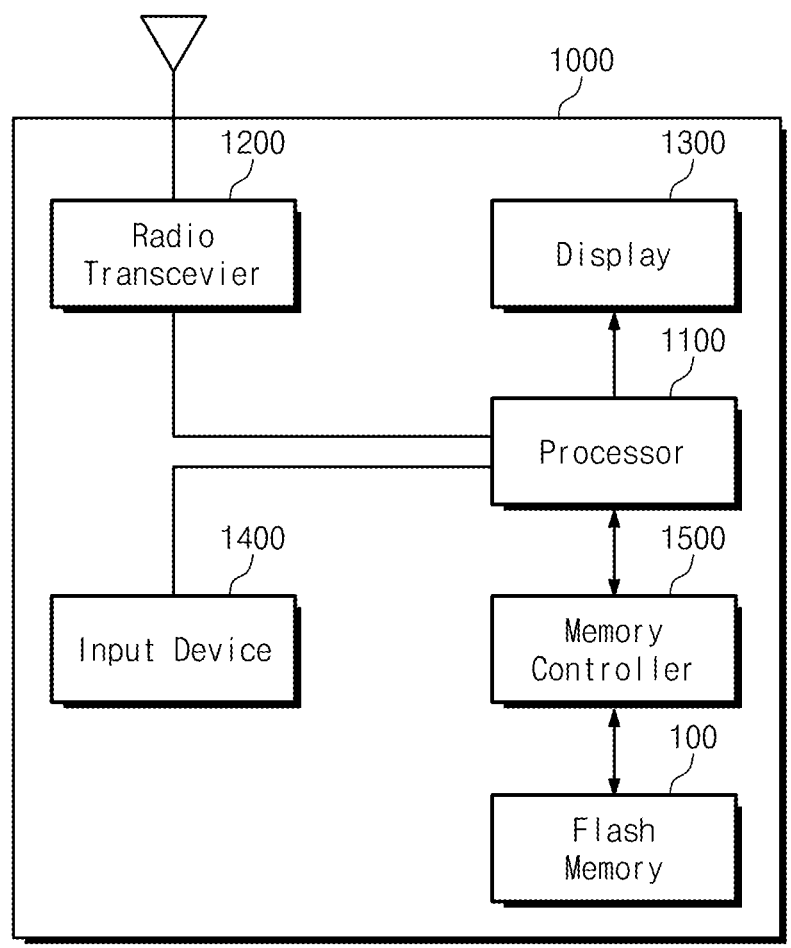
FIG. 12 is a block diagram schematically illustrating an electronic device including a nonvolatile memory device according to example embodiments of inventive concepts.

FIG. 12 is a block diagram schematically illustrating an electronic device including a nonvolatile memory device according to example embodiments of inventive concepts. Referring to FIG. 12, an electronic device 1000 such as a cellular phone, a smart phone, or a tablet PC may include a flash memory device 100 and a memory controller 1500 controlling an operation of the flash memory device 100.

The flash memory device 100 may correspond to a three-dimensional nonvolatile memory device described in relation to FIGS. 1 to 11. The memory controller 1500 may be controlled by a processor 1100 controlling an overall operation of the electronic device 1000. Data stored in the flash memory device 100 may be displayed via a display 1300 under the control of the memory controller 1500 that operates in response to the control of a processor 1100.

A radio transceiver 1200 may transmit and receive a radio signal via an antenna. For example, the radio transceiver 1200 may convert a radio signal received via the antenna to a signal suitable for the processor 1100 to process. The processor 1100 may process a signal output from the radio transceiver 1200, and the processed signal may be stored in the flash memory device 100 via the memory controller 1500 or displayed via the display 1300. The radio transceiver 1200 may convert a signal from the processor 1100 to a radio signal to output it to an external device via the antenna.

An input device 1400 may be a device capable of receiving a control signal for controlling an operation of the processor 1100 or data to be processed by the processor 1100. The input device 1400 may include a pointing device such as a touch pad or a computer mouse, a keypad, or a keyboard.

The processor 1100 may control the display 1300 so as to display data output from the flash memory device 100, a radio signal from the radio transceiver 1200, or data from the input device 1400.

Figure 13:
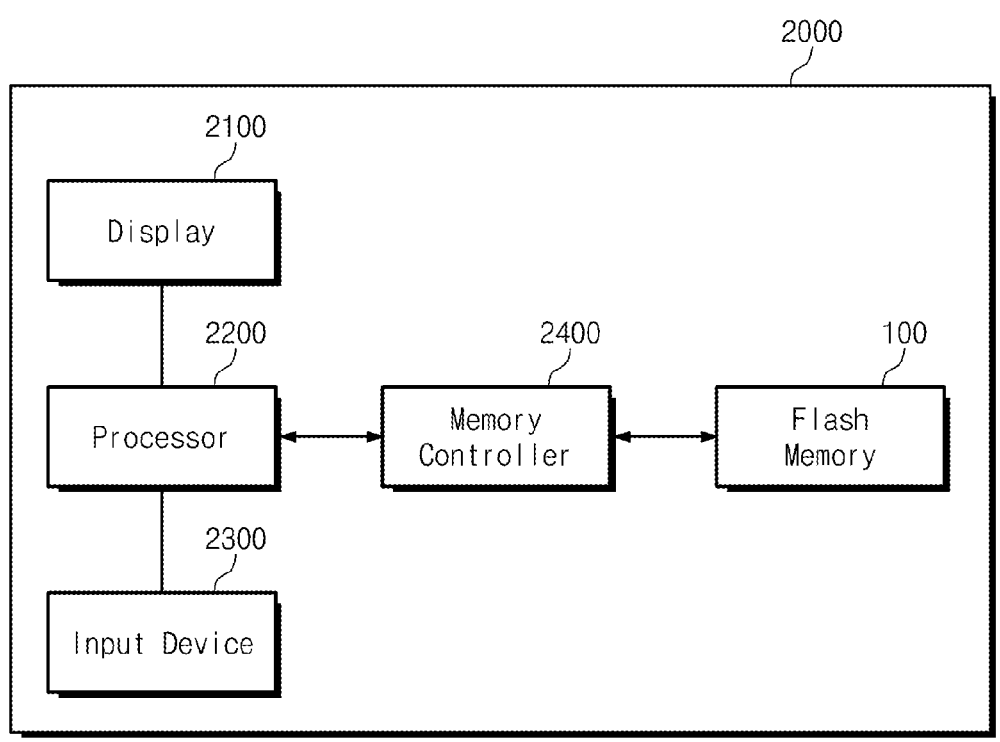
FIG. 13 is a block diagram schematically illustrating an electronic device including a nonvolatile memory device according to example embodiments of inventive concepts.

FIG. 13 is a block diagram schematically illustrating an electronic device including a nonvolatile memory device according to example embodiments of inventive concepts.

Referring to FIG. 13, an electronic device 2000 may be a data processing device such as a personal computer, a tablet computer, a net-book, an e-reader, a PDA, a PMP, an MP3 player, or an MP4 player, and may include a flash memory device 100 and a memory controller 2400 controlling an operation of the flash memory device 100. The flash memory device 100 may correspond to a three-dimensional nonvolatile memory device described in relation to FIGS. 1 to 11.

The electronic device 2000 may include a processor 2200 controlling an overall operation of the electronic device 2000. The memory controller 2400 may be controlled by the processor 2200. The processor 2200 may display data, stored in the flash memory device 100, via a display 2100 according to an input signal generated by an input device 2300. For example, the input device 2300 may be formed of a pointing device such as a touch pad or a computer mouse, a keypad, or a keyboard.

Figure 14:
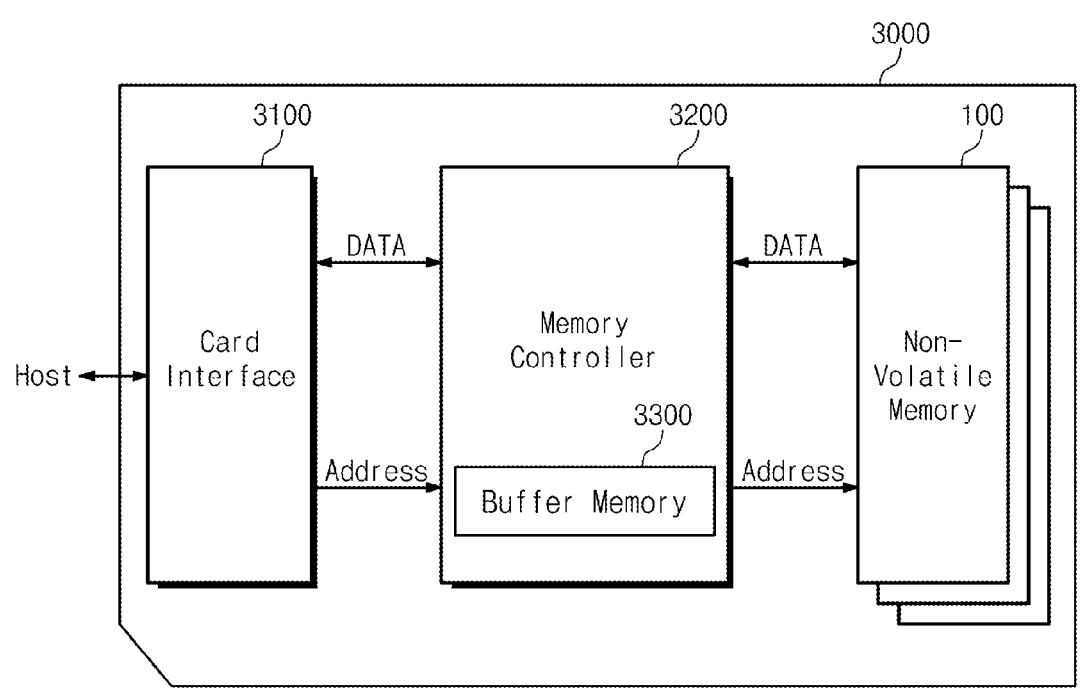
FIG. 14 is a block diagram schematically illustrating an electronic device including a nonvolatile memory device according to example embodiments of inventive concepts.

FIG. 14 is a block diagram schematically illustrating an electronic device including a nonvolatile memory device according to example embodiments of inventive concepts. Referring to FIG. 14, an electronic device 3000 may include a card interface 3100, a memory controller 3200, and a nonvolatile memory device 100, for example, a flash memory device.

The electronic device 3000 may exchange data with a host via card interface 3100. In example embodiments, the card interface 3100 may be an SD card interface or an MMC interface. However, example embodiments of inventive concepts are not limited thereto. The card interface 3100 may exchange data between the host and the memory controller 3200 according to the communication protocol of the host capable of communicating with the electronic device 3000.

The memory controller 3200 may control an overall operation of the electronic device 3000, and may control data exchange between the card interface 3100 and the nonvolatile memory device 100. A buffer memory 3300 of the memory controller 3200 may buffer data transferred between the card interface 3100 and the nonvolatile memory device 100.

The memory controller 3200 may be connected to the card interface 3100 and the nonvolatile memory device 100 via a data bus and an address bus. In example embodiments, the memory controller 3200 may receive an address of data to be read or written via the address bus from the card interface 3100 to send it to the nonvolatile memory device 100.

The memory controller 3200 may receive or send data to be read or to be written via the data bus connected to the card interface 3100 or the nonvolatile memory device 100.

The nonvolatile memory device 100 may correspond to a three-dimensional nonvolatile memory device described in relation to FIGS. 1 to 11.

The nonvolatile memory device 100 may store various data. In example embodiments, a read operation and a write operation may be simultaneously performed at the nonvolatile memory device 100. At this time, a memory cell array of the nonvolatile memory device 100, in which a read operation is executed, may be different from a memory cell array of the nonvolatile memory device 100 in which a write operation is executed.

When the electronic device 3000 in FIG. 14 is connected to a host such as a PC, a tablet PC, a digital camera, a digital audio player, a cellular phone, a console video game hardware, or a digital set-top box, the host may send or receive data stored in the nonvolatile memory device 100 via the card interface 3100 and the memory controller 3200.

Figure 15:
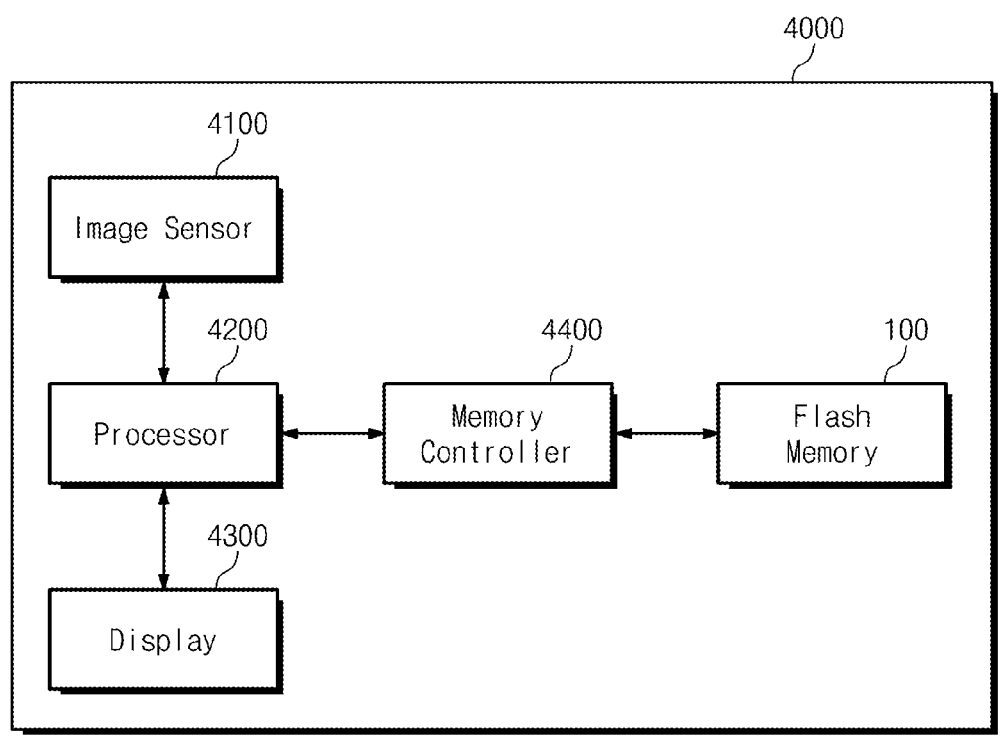
FIG. 15 is a block diagram schematically illustrating an electronic device including a nonvolatile memory device according to example embodiments of inventive concepts.

FIG. 15 is a block diagram schematically illustrating an electronic device including a nonvolatile memory device according to example embodiments of inventive concepts. Referring to FIG. 15, an electronic device 4000 may include a flash memory device 100, a memory controller 4400 controlling a data processing operation of the flash memory device 100, and a processor 4100 controlling an overall operation of the electronic device 4000. The flash memory device 100 may correspond to a three-dimensional nonvolatile memory device described in relation to FIGS. 1 to 11.

An image sensor 4200 of the electronic device 4000 may convert an optical signal to a digital signal, and the digital signal may be stored in the flash memory device 100 or displayed via a display 4300 under the control of the processor 4200.

Figure 16:
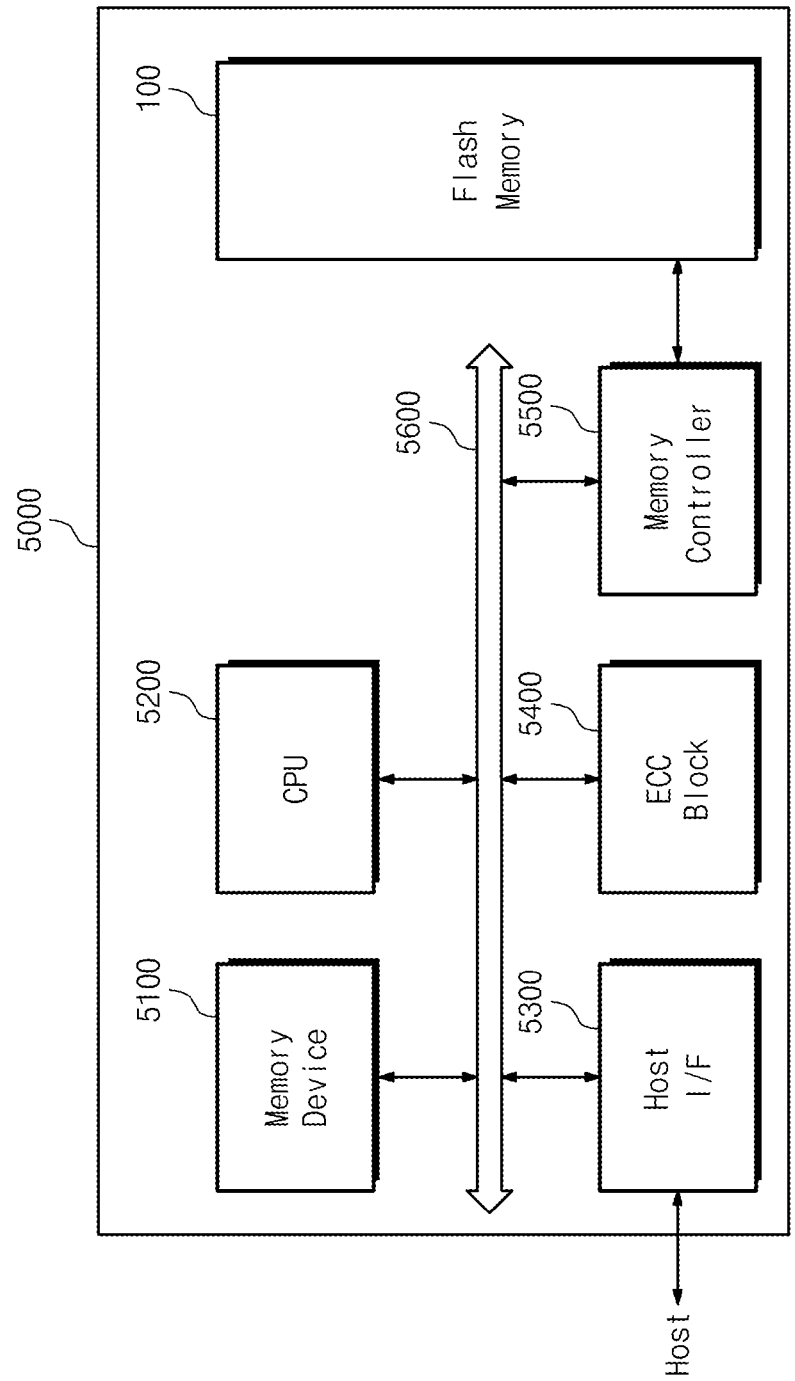
FIG. 16 is a block diagram schematically illustrating an electronic device including a nonvolatile memory device according to example embodiments of inventive concepts.

FIG. 16 is a block diagram schematically illustrating an electronic device including a nonvolatile memory device according to example embodiments of inventive concepts. Referring to FIG. 16, an electronic device 5000 may include a flash memory device 100, a memory controller 5500 controlling an operation of the flash memory device 100, and a CPU 5200 controlling an overall operation of the electronic device 5000. The flash memory device 100 may be a three-dimensional nonvolatile memory device 100 described in relation to FIGS. 1 to 11.

The electronic device 5000 may include a memory 5100 that is used as a working memory of the CPU 5200. The memory 5100 may be formed of a nonvolatile memory device such as ROM or a volatile memory such as DRAM.

A host connected with the electronic device 5000 may exchange data with the flash memory device 100 via a memory controller 5500 and a host interface 5300. At this time, the memory controller 5500 may perform a memory interface, for example, a flash memory interface function.

The electronic device 5000 may further include an ECC block 5400. The ECC block 5400 may operate responsive to the control of the CPU 5200, and may detect and correct an error of data read from the flash memory device 100 via the memory controller 5500.

The CPU 5200 may control data exchange among the memory controller 5500, the ECC block 5400, the host interface 5300, and the memory 5100 via a bus 5600. The electronic device 5000 may be formed of a USB memory drive or a memory stick.

Figure 17:
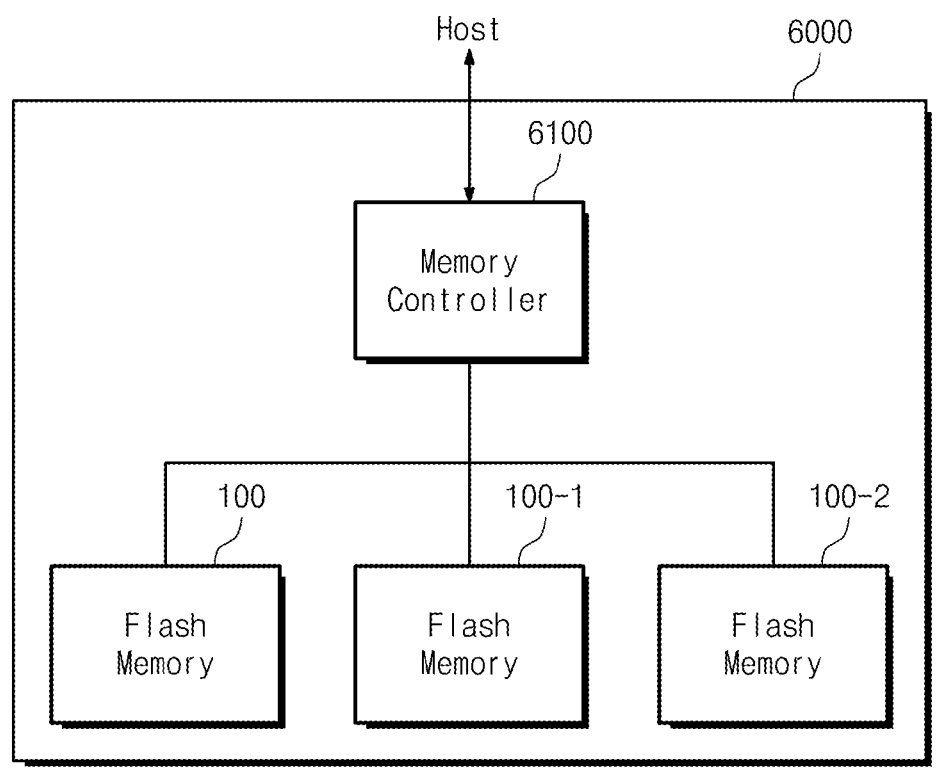
FIG. 17 is a block diagram schematically illustrating an electronic device including a nonvolatile memory device according to example embodiments of inventive concepts.

FIG. 17 is a block diagram schematically illustrating an electronic device including a nonvolatile memory device according to example embodiments of inventive concepts. Referring to FIG. 17, an electronic device 6000 may be implemented by a data storage device such as a Solid State Drive (SSD).

The electronic device 6000 may include a plurality of flash memory devices 100, 100-1, and 100-2 and a memory controller 6100 controlling a data processing operation of each of the plurality of flash memory devices 100, 100-1, and 100-2. Each of the flash memory devices 100, 100-1, and 100-2 may be a three-dimensional nonvolatile memory device 100 described in relation to FIGS. 1 to 11. The electronic device 6000 may be implemented by a memory system or a memory module. The controller 6100 can be implemented outside or inside of the electronic device 6000.

While some example embodiments have been particularly shown and described, it will be understood by one of ordinary skill in the art that variations in form and detail may be made therein without departing from the spirit and scope of the claims.

What is claimed is:

1. A nonvolatile memory device comprising:
a first NAND string including a first string selection transistor, a first local ground selection transistor, a first global ground selection transistor, and a plurality of first memory cells stacked in a direction perpendicular to a substrate;
a second NAND string including a second string selection transistor, a second local ground selection transistor, a second global ground selection transistor, and a plurality of second memory cells stacked in the direction perpendicular to the substrate,
the second string selection transistor of the second NAND string being electrically isolated from the first string selection transistor of the first NAND string,
the second global ground selection transistor of the second NAND string being electrically connected to the first global ground selection transistor of the first NAND string; and
a selection line driver including path transistors configured to select and provide at least one operation voltage to the first and second string selection transistors, the first and second local ground selection transistors, and the first and second global ground selection transistors.

2. The nonvolatile memory device of claim 1, wherein the first and second local ground selection transistors are connected to different path transistors among the path transistors of the selection line driver.

3. The nonvolatile memory device of claim 1, wherein the first string selection transistor and the first local ground selection transistor are electrically connected to each other.

4. The nonvolatile memory device of claim 3, wherein the selection line driver is configured to supply an identical operation voltage to the first string selection transistor and the first local ground selection transistor.

5. The nonvolatile memory device of claim 1, wherein the second string selection transistor and the second local ground selection transistor are electrically connected to each other.

6. The nonvolatile memory device of claim 5, wherein the second string selection transistor and the second local ground selection transistor are connected in common to one of the path transistors of the selection line driver.

7. The nonvolatile memory device of claim 1, further comprising:
first and second bit lines connected with the first and second string selection transistors, respectively.

8. The nonvolatile memory device of claim 1, wherein
the first global ground selection transistor is between the first local ground selection transistor and a common source line, and
the second global ground selection transistor is between the second local ground selection transistor and the common source line.

9. The nonvolatile memory device of claim 1, further comprising:
a global ground selection line connecting the first and second global ground selection transistors.

10. The nonvolatile memory device of claim 9, wherein the selection line driver further comprises:
a global path transistor configured to provide one of the at least one operation voltage to the first and second global ground selection transistors.

11. The nonvolatile memory device of claim 1, further comprising:
a first word line electrically connecting at least one of the plurality of first memory cells to at least one of the plurality of second memory cells.

12. The nonvolatile memory device of claim 11, wherein the first word line electrically connects one of the plurality of first memory cells and one of the plurality of the second memory cells at an equal height from the substrate.

13. A nonvolatile memory system comprising:
a plurality of nonvolatile memory devices according to claim 1; and
a memory controller configured to control the plurality of nonvolatile memory devices.

14. The nonvolatile memory system of claim 13, wherein the memory controller includes:
an ECC unit configured to correct errors of data received from the plurality of nonvolatile memory devices.

15. A nonvolatile memory device comprising:
a first NAND string including a first string selection transistor, a first local ground selection transistor, a first global ground selection transistor, and a plurality of first memory cells stacked in a direction perpendicular to a substrate;
a second NAND string including a second string selection transistor, a second local ground selection transistor, a second global ground selection transistor, and a plurality of second memory cells stacked in the direction perpendicular to the substrate; and a global ground selection line connecting the first and second global ground selection transistors;
a first selection line connecting the first string selection transistor and the first local ground selection transistor of the first NAND string; and
a second selection line connecting the second string selection transistor and the second local ground selection transistor of the second NAND string,
the first and second selection lines being electrically isolated from each other.

16. The nonvolatile memory device of claim 15, further comprising:
a selection line driver configured to select and provide at least one operation voltage to the first and second selection lines.

17. The nonvolatile memory device of claim 16, wherein the selection line driver includes first and second path transistors,
the first selection line is connected to the first path transistor, and
the second selection line being connected to the second path transistor.

18. A nonvolatile memory system comprising:
at least one nonvolatile memory device according to claim 15;
a card interface configured to communicate with a host; and
a memory controller configured to control a communication between the at least one nonvolatile memory device and the card interface, and to control the at least one nonvolatile memory device.

19. A nonvolatile memory device comprising:
a plurality of memory cell strings, each of the plurality of memory cell strings including a string selection transistor, a local ground selection transistor, and a plurality of memory cells stacked in a direction perpendicular to a substrate; and
first to third local ground selection lines connected to the local ground selection transistors of first to third memory cell strings of the plurality of memory cell strings; and
a selection line driver including a first path transistor, the first path transistor being connected to the first local ground selection line and one of a gate of the string selection transistor in the first memory cell string and the second local ground selection line,
wherein a first operation voltage is provided to the first and second local ground selection lines, and a second operation voltage is provided to the third local ground selection line.

20. The nonvolatile memory device of claim 19, wherein the selection line driver includes a second path transistor,
the first and second local ground selection lines are connected to the first path transistor, and
the third local ground selection line is connected to the second path transistor.

21. The nonvolatile memory device of claim 19, further comprising:
a global ground selection line between the first to third local ground selection lines and a common source line,
wherein the first to third local ground selection lines are electrically isolated from the global ground selection line.

22. A nonvolatile memory device comprising:
a substrate;
a first string including a plurality of first memory cells stacked on top of each other on the substrate and a first local ground selection transistor between the substrate and the plurality of first memory cells;

a second string including a plurality of second memory cells stacked on top of each other on the substrate and a second local ground selection transistor between the substrate and the plurality of second memory cells, the first and second local ground selection transistors being at a same height over the substrate;
a first path transistor configured to provide at least one operation voltage to the first local ground selection transistor through a first local ground selection line, and
a second path transistor configured to provide the at least one operation voltage to the second local ground selection transistor through a second local ground selection line that is electrically isolated from the first local ground selection line.

23. A nonvolatile memory device comprising:
first memory cells stacked in a direction perpendicular to a substrate;
second memory cells stacked in the direction perpendicular to the substrate;
third memory cells stacked in the direction perpendicular to the substrate;
a first local ground selection transistor between the substrate and the first memory cells;
a second local ground selection transistor between the substrate and the second memory cells;
a third local ground selection transistor between the substrate and the third memory cells;
a first path transistor connected to the first and second local ground selection transistors,
the first path transistor being configured to provide at least one operation voltage to the first and second local ground selection transistors; and
a second path transistor connected to the third local ground selection transistor,
the second path transistor being configured to provide the at least one operation voltage to the third local ground selection transistor.

24. A nonvolatile memory device comprising:
first memory cells connected between a first ground selection transistor and a first string selection transistor and stacked in a direction perpendicular to a substrate;
second memory cells connected between a second ground selection transistor and a second string selection transistor and stacked in the direction perpendicular to the substrate; and
a plurality of path transistors configured to provide at least one operation voltage to the first and second string selection transistors and the first and second ground selection transistors,
wherein the first string selection transistor and the first ground selection transistor are connected to a first path transistor, and the second string selection transistor and the second ground selection transistor are connected to a second path transistor.

25. A nonvolatile memory device comprising:
M rows×N columns of NAND strings on a substrate,
each NAND string including a string selection transistor, 1 to K memory cells, a local ground selection transistor, and a global ground selection transistor on the substrate,
M, N, and K each independently being integers greater than 1;
a driver circuit,
the driver circuit configured to select one of the M rows of NAND strings and to provide a first voltage to each string selection transistor and each local ground selection transistor of the selected one of the M rows of NAND strings, the driver circuit configured to unselect M−1 rows of the M rows of NAND strings and to apply a second voltage to each string selection transistor and each local ground selection transistor of the unselected M−1 rows of the M rows of NAND strings, the second voltage being different than the first voltage.

26. The nonvolatile memory device of claim 25, further comprising:

N bitlines, each one of the N bit lines being connected in common to each NAND string along one of the N columns of the M rows×N columns of NAND strings; and 1 to K word lines, each of the 1 to K word lines being connected to a corresponding one of the 1 to K memory cells of the M rows×N columns NAND strings, wherein the driver circuit is configured to select one of the 1 to K word lines and to apply a third voltage to the selected one of the 1 to K word lines, the third voltage is different from the first and second voltages, the driver circuit is configured to unselect K−1 of the 1 to K word lines and to apply the first voltage to the unselected K−1 of the 1 to K word lines.

27. The nonvolatile memory device of claim 25, wherein
the driver circuit includes 1 to N first path transistors, each of the 1 to N first path transistors is connected in common to each string selection transistor and each local ground selection transistor along one of the M rows of NAND strings, the driver circuit includes a second path transistor that is configured to provide the first voltage to the global ground selection transistor of each of the M rows×N columns of NAND strings.

28. The nonvolatile memory device of claim 25, wherein
the driver circuit includes 1 to N first path transistors, each of the 1 to N first path transistors is connected in common to each string selection transistor along one of the M rows of NAND strings, the driver circuit includes a second path transistor that is configured to provide the first voltage to the global ground selection transistor of each of the M rows×N columns of NAND strings, the driver circuit includes 1 to J third path transistors, each of the 1 to J third path transistors is connected in common to each local ground selection transistor along two of the M rows of NAND strings, J is an integer less than N, and N is an integer greater than 2.

29. The nonvolatile memory device of claim 25, wherein
the driver circuit includes 1 to N first path transistors, each of the 1 to N first path transistors is connected in common to each string selection transistor along one of the M rows of NAND strings, the driver circuit includes a second path transistor that is configured to provide the first voltage to the global ground selection transistor of each of the M rows×N columns of NAND strings, and the driver circuit includes 1 to N third path transistors, each of the 1 to N third path transistors is connected in common to each local ground selection transistor along one of the M rows of NAND strings.

30. An electronic device comprising:

at least one nonvolatile memory device according to claim 25; and a memory controller connected to the at least one nonvolatile memory device, the memory controller configured to control at least one operation of the at least one nonvolatile memory device.

31. The nonvolatile memory device of claim 19, wherein the first path transistor is connected to the first local ground selection line and the gate of the string selection transistor in the first memory cell string.

* * * * *